(12) United States Patent
Takamura et al.

(10) Patent No.: US 10,804,286 B2
(45) Date of Patent: Oct. 13, 2020

(54) SEMICONDUCTOR DEVICE AND MANUFACTURING METHOD OF SEMICONDUCTOR DEVICE

(71) Applicant: Toshiba Memory Corporation, Minato-ku (JP)

(72) Inventors: Kazuhide Takamura, Nagoya (JP); Takuya Inatsuka, Yokkaichi (JP)

(73) Assignee: Toshiba Memory Corporation, Minato-ku (JP)

( * ) Notice: Subject to any disclaimer, the term of this patent is extended or adjusted under 35 U.S.C. 154(b) by 0 days.

(21) Appl. No.: 16/111,402

(22) Filed: Aug. 24, 2018

(65) Prior Publication Data
US 2019/0280004 A1  Sep. 12, 2019

(30) Foreign Application Priority Data
Mar. 6, 2018  (JP) .................. 2018-039540

(51) Int. Cl.
| | |
|---|---|
| *H01L 27/11582* | (2017.01) |
| *H01L 23/522* | (2006.01) |
| *H01L 23/528* | (2006.01) |
| *H01L 29/10* | (2006.01) |
| *H01L 27/11568* | (2017.01) |
| *H01L 21/311* | (2006.01) |
| *H01L 21/02* | (2006.01) |

(Continued)

(52) U.S. Cl.
CPC .. *H01L 27/11582* (2013.01); *H01L 21/31116* (2013.01); *H01L 23/528* (2013.01); *H01L 23/5226* (2013.01); *H01L 27/11568* (2013.01); *H01L 29/1037* (2013.01); *H01L 21/0217* (2013.01); *H01L 21/0228* (2013.01); *H01L 21/02164* (2013.01); *H01L 21/02274* (2013.01); *H01L 21/0337* (2013.01); *H01L 21/31111* (2013.01); *H01L 21/31144* (2013.01); *H01L 21/76897* (2013.01)

(58) Field of Classification Search
CPC ......... H01L 27/11582; H01L 21/31116; H01L 27/11568; H01L 29/1037; H01L 23/528; H01L 23/5226; H01L 27/11565; H01L 27/11575
See application file for complete search history.

(56) References Cited

U.S. PATENT DOCUMENTS

| | | | |
|---|---|---|---|
| 2015/0179564 A1* | 6/2015 | Lee | .............. H01L 27/11548 257/756 |
| 2015/0255484 A1* | 9/2015 | Imamura | ........... H01L 27/11582 257/314 |

(Continued)

*Primary Examiner* — Bilkis Jahan
*Assistant Examiner* — Victor V Barzykin
(74) *Attorney, Agent, or Firm* — Oblon, McClelland, Maier & Neustadt, L.L.P.

(57) ABSTRACT

According to one embodiment, a semiconductor device includes: a stack body including an insulator, a first conductor and a second conductor stacked stepwise by interposing the insulator and electrically disconnected from each other; and a first contact plug which reaches the first conductor from a region above the stack body. The first conductor includes a first portion positioned below the insulator, a second portion positioned above the insulator, and a third portion that electrically connects the first portion of the first conductor and the second portion of the first conductor. The third portion of the first conductor is provided in an opening formed on the insulator.

10 Claims, 27 Drawing Sheets

(51) Int. Cl.
*H01L 21/768* (2006.01)
*H01L 21/033* (2006.01)

(56) References Cited

U.S. PATENT DOCUMENTS

| | | | |
|---|---|---|---|
| 2015/0270165 A1* | 9/2015 | Hyun | H01L 21/76843 |
| | | | 257/329 |
| 2016/0197090 A1* | 7/2016 | Sasaki | H01L 27/11568 |
| | | | 438/268 |
| 2017/0194255 A1 | 7/2017 | Oh | |
| 2017/0271256 A1 | 9/2017 | Inatsuka | |
| 2018/0277558 A1* | 9/2018 | Lee | H01L 27/11575 |

* cited by examiner

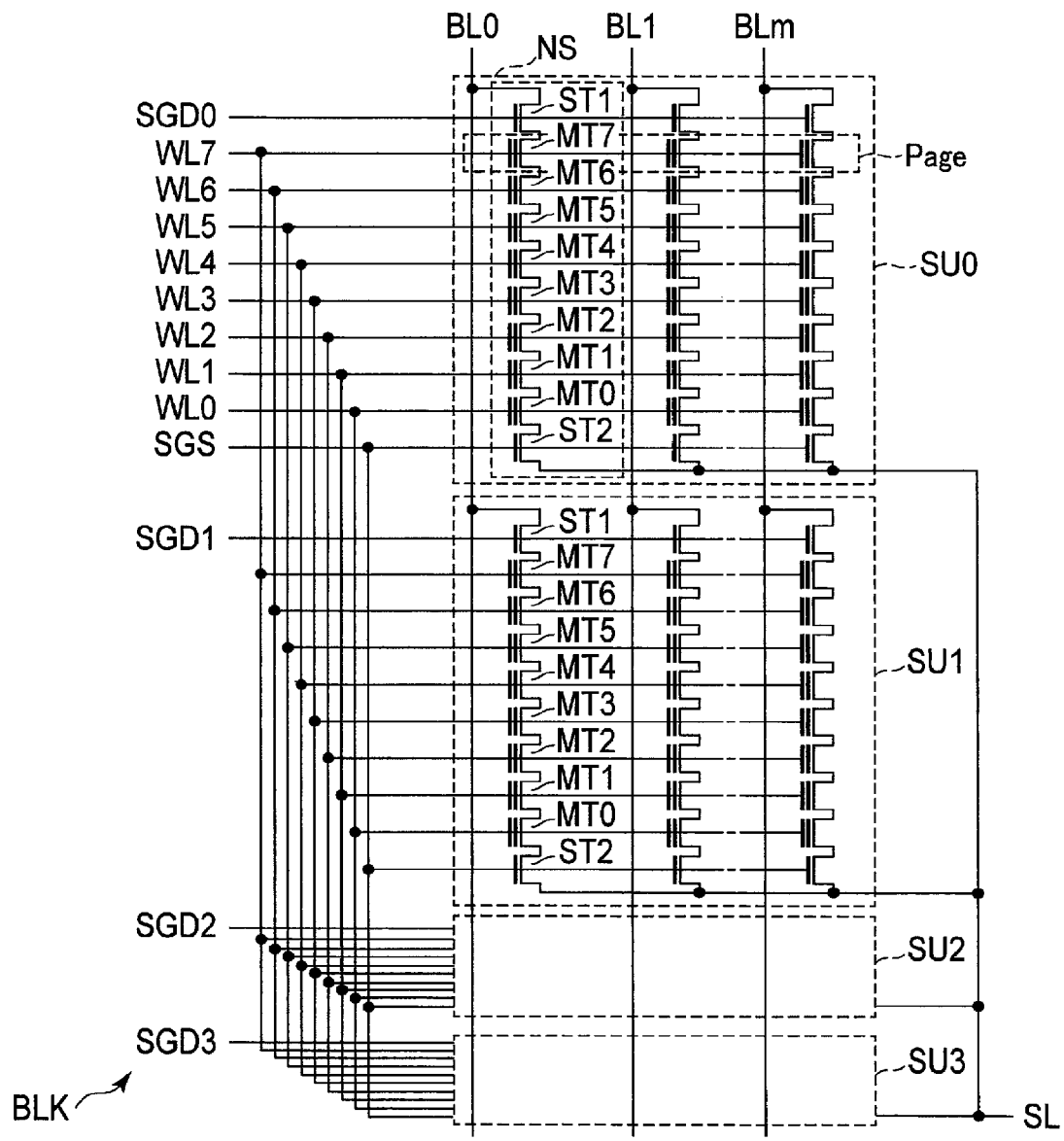
F I G. 2

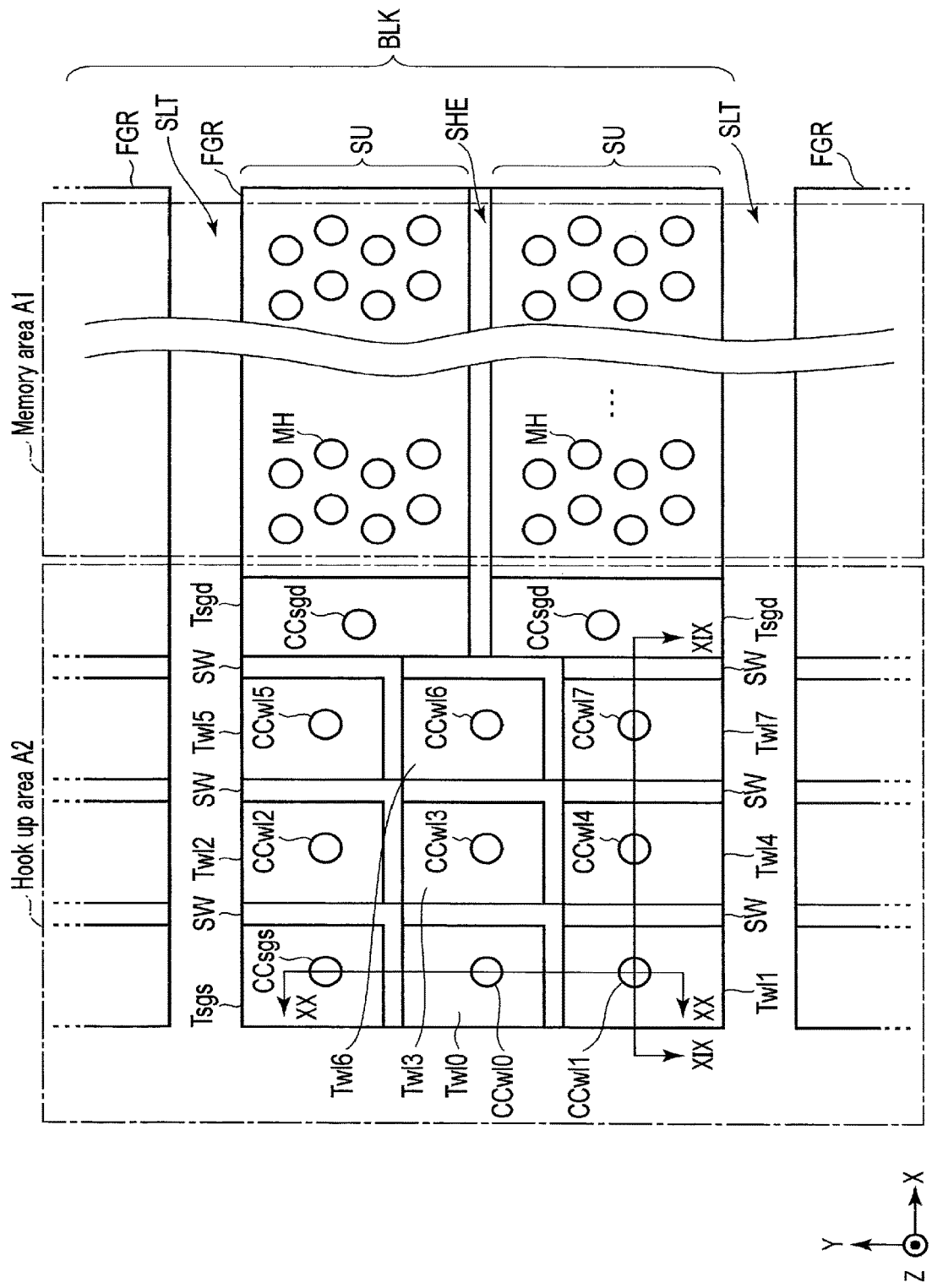
F I G. 18

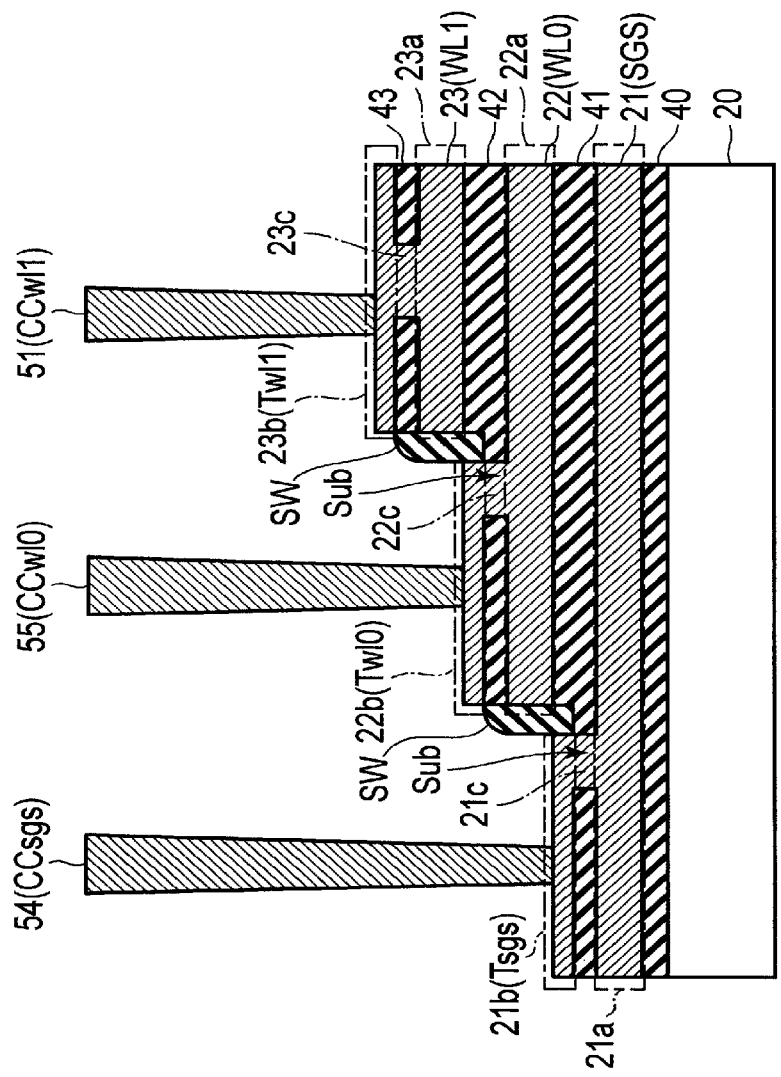
F I G. 20

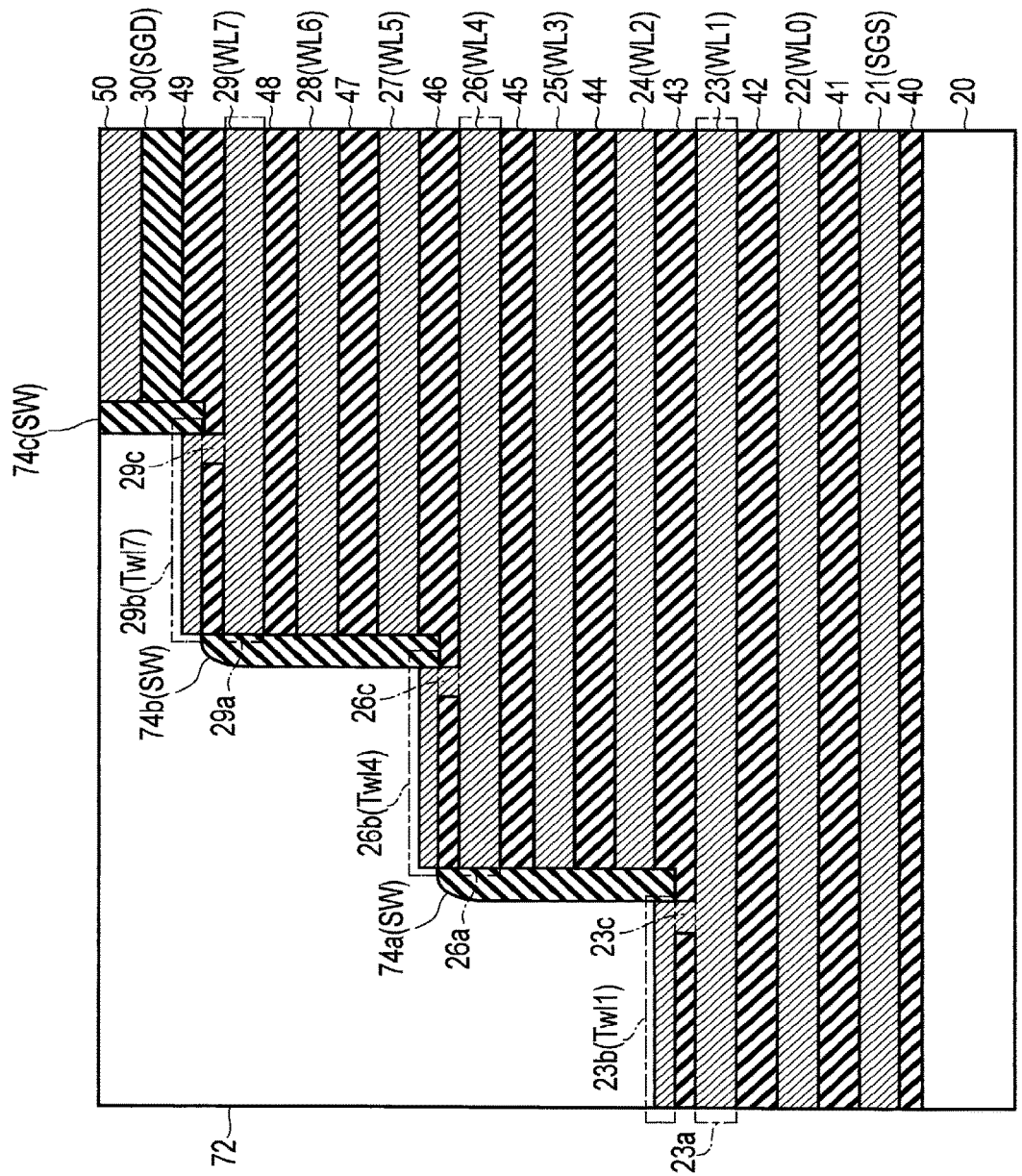
F I G. 26

SEMICONDUCTOR DEVICE AND MANUFACTURING METHOD OF SEMICONDUCTOR DEVICE

CROSS-REFERENCE TO RELATED APPLICATIONS

This application is based upon and claims the benefit of priority from Japanese Patent Application No. 2018-039540, filed Mar. 6, 2018, the entire contents of which are incorporated herein by reference.

FIELD

Embodiments described herein relate generally to a semiconductor device and a manufacturing method of the semiconductor device.

BACKGROUND

A NAND type flash memory in which memory cells are stacked three-dimensionally is known.

BRIEF DESCRIPTION OF THE DRAWINGS

FIG. 2 is a circuit diagram for explaining a configuration of a memory cell array of the semiconductor memory according to the first embodiment.

FIG. 18 is a plan view for explaining a configuration of a memory area and a hook-up area of a semiconductor memory according to a second embodiment.

FIG. 20 is a cross-sectional view for explaining a configuration of the hook-up area of the semiconductor memory according to the second embodiment.

FIG. 26 is a cross-sectional view for explaining the manufacturing method of the semiconductor memory according to the second embodiment.

DETAILED DESCRIPTION

In general, according to one embodiment, a semiconductor device includes: a stack body including an insulator, a first conductor and a second conductor stacked stepwise by interposing the insulator and electrically disconnected from each other; and a first contact plug which reaches the first conductor from a region above the stack body. The first conductor includes a first portion positioned below the insulator, a second portion positioned above the insulator, and a third portion that electrically connects the first portion of the first conductor and the second portion of the first conductor. The third portion of the first conductor is provided in an opening formed on the insulator.

Hereinafter, the embodiments will be described with reference to the accompanying drawings. The drawings are schematic. Each embodiment is an example of an apparatus or a method to embody a technical idea of the invention. In the explanation below, constituent elements having the same functions and configurations will be denoted by the same reference symbols. The numbers after the letters constituting the reference symbols are used to discriminate elements which are denoted by the reference symbols including the same letters and which have similar configurations. If there is no need of mutually distinguishing the elements which are denoted by the reference symbols that include the same letters, the same elements are denoted by the reference symbols that include only the same letters.

1. First Embodiment

A semiconductor memory according to a first embodiment will be described.

1.1 Configuration

1.1.1 Configuration of a Semiconductor Memory

Figure 1:
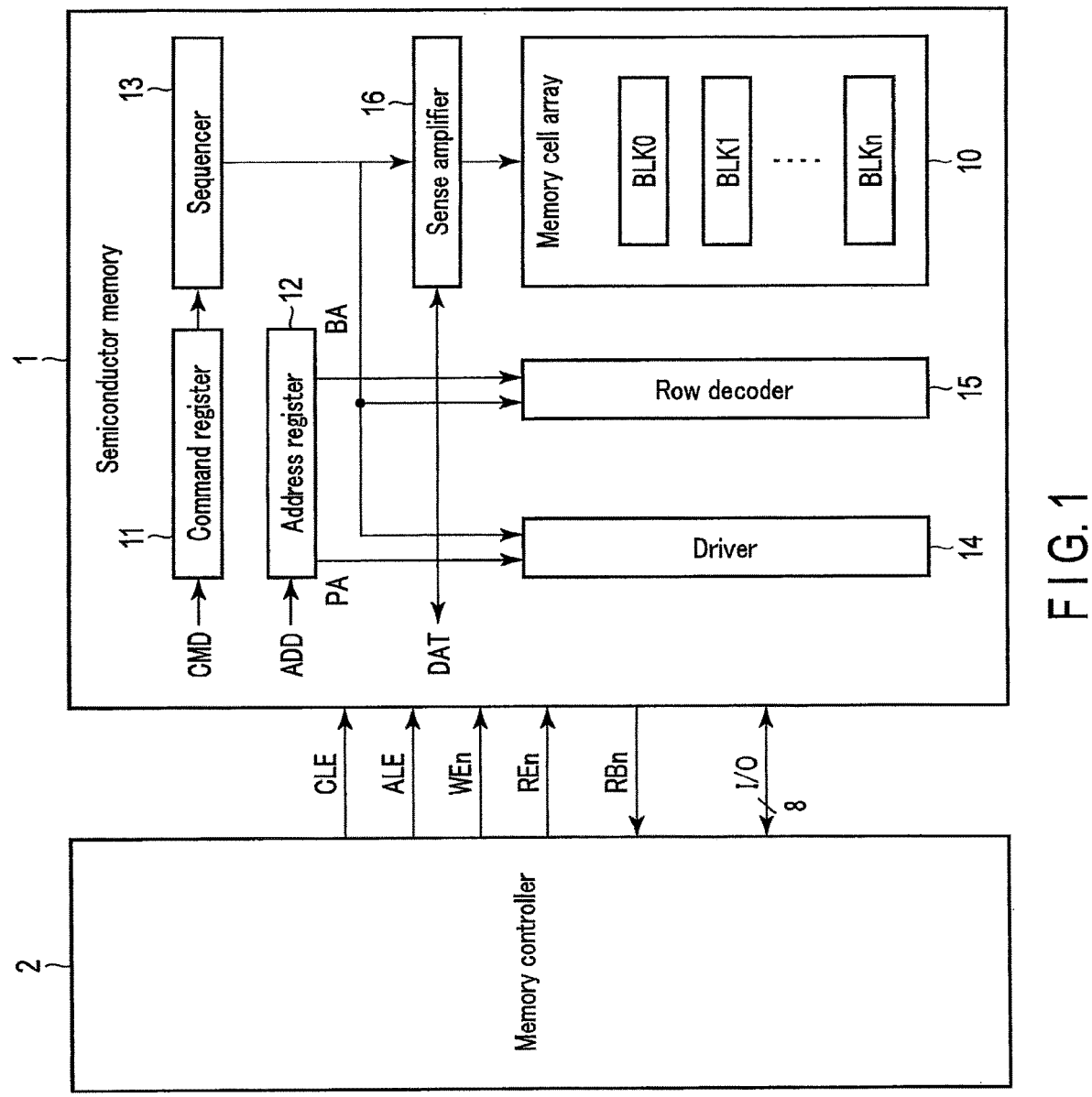
FIG. 1 is a block diagram for explaining a configuration of a semiconductor memory according to a first embodiment.

FIG. 1 is a block diagram for explaining a configuration of the semiconductor memory according to the first embodiment. As shown in FIG. 1, a semiconductor memory 1 is a NAND type flash memory that is capable of, for example, storing data in a non-volatile manner. The semiconductor memory 1 includes, for example, a memory cell array 10, a command register 11, an address register 12, a sequencer 13, a driver 14, a row decoder 15, and a sense amplifier 16.

The memory cell array 10 includes a plurality of blocks BLK0 to BLKn (n is an integer equal to or greater than 1). A block BLK is a set of non-volatile memory cells, and is, for example, a unit of data erasure. In the memory cell array 10, a plurality of bit lines and a plurality of word lines are provided, and each memory cell is associated with one bit line and one word line. The memory cell array 10 will be described later in detail.

The command register 11 retains a command CMD that is received by the semiconductor memory 1 from an external memory controller 2. The command CMD includes commands to cause the sequencer 13 to execute a read operation and a write operation, for example.

The address register 12 retains address information ADD that is received by the semiconductor memory 1 from the memory controller 2. The address information ADD includes, for example, a block address BA and a page address PA. The block address BA is used to select a block BLK that includes a memory cell that is a target for various types of operations. The page address PA is used to select a word line that is associated with a memory cell that is a target for various types of operations.

The sequencer 13 controls the operation of the entire semiconductor memory 1 based on the command CMD retained in the command register 11. For example, the sequencer 13 controls the driver 14, the row decoder 15, and the sense amplifier 16 to perform a write operation for data DAT received from the memory controller 2.

The driver 14 generates a desired voltage based on the control of the sequencer 13. Subsequently, the driver 14 respectively applies, to corresponding signal lines, a voltage to be applied to a word line that is selected based on a page address PA retained in the address register 12, and a voltage to be applied to word lines that are not selected.

The row decoder 15 selects one block BLK based on a block address BA retained in the address register 12. The row decoder 15 then applies the voltage that is applied to each signal line by the driver 14 to each of a selected word line and unselected word lines, for example.

The sense amplifier 16 applies a desired voltage to each bit line in accordance with write data DAT received from the memory controller 2. The sense amplifier 16 determines data stored in a memory cell based on the voltage of the bit line, and transmits the determined read data DAT to the memory controller 2.

The communication between the semiconductor memory 1 and the memory controller 2 is supported by, for example, a NAND interface standard. For example, the memory controller 2 transmits a command latch enable signal CLE, an address latch enable signal ALE, a write enable signal WEn, and a read enable signal REn, receives a ready/busy signal RBn, and transmits and receives an input/output signal I/O. The signal CLE is a signal notifying the semiconductor memory 1 that the received signal I/O is a command CMD. The signal ALE is a signal notifying to the semiconductor memory 1 that the received signal I/O is address information ADD. The signal WEn is a signal instructing the semiconductor memory 1 to input the signal I/O. The signal REn is a signal instructing the semiconductor memory 1 to output the signal I/O. The signal RBn is a signal for notifying the memory controller 2 of whether the semiconductor memory 1 is in a ready state in which a command from the controller 2 can be received, or in a busy state in which a command from the memory controller 2 cannot be received. The signal I/O is, for example, an 8-bit signal, and may include a command CMD, address information ADD, write data DAT, and read data DAT.

The semiconductor memory 1 and the memory controller 2 as explained in the above may constitute one semiconductor device by a combination thereof. Such a semiconductor device may be a memory card, such as an SD™ card, and an SSD (solid state drive), for example.

1.1.2 Circuit Configuration of a Memory Cell Array

FIG. 2 shows an example of a circuit configuration of the memory cell array 10 according to the first embodiment. The circuit configuration of the memory cell array 10 according to the first embodiment will be explained below, focusing on one block BLK.

A block BLK includes, for example, four string units SU0 to SU3, as shown in FIG. 2. Each string unit SU includes a plurality of NAND strings NS that are respectively associated with the bit lines BL0 to BLm (m is an integer equal to or greater than 1). A NAND string NS includes, for example, eight memory cell transistors MT0 to MT7 and selection transistors ST1 and ST2.

Memory cell transistor MT is provided with a control gate and a charge storage layer, and stores data in a nonvolatile manner. The memory cell transistors MT0 to MT7 included in each NAND string NS are coupled in series between the source of the selection transistor ST1 and the drain of the selection transistor ST2. The control gates of the memory cell transistors MT0 to MT7 in the same block BLK are respectively coupled to the word lines WL0 to WL7. A set of 1-bit data that is stored in the plurality of memory cell transistors MT coupled in common to a word line WL in each string unit SU is called a "page".

The selection transistors ST1 and ST2 are used to select a string unit SU at the time of various types of processing. The gates of the selection transistors ST1 included in the string units SU0 to SU3 in the same block BLK are respectively coupled in common to the selection gate lines SGD0 to SGD3. The drains of the selection transistors ST1 in the same column in each block BLK are coupled in common to the corresponding bit line BL. The gates of the selection transistors ST2 in the same block BLK are coupled in common to a selection gate line SGS. The sources of the selection transistors ST2 in the each block BLK are coupled in common to a source line SL between multiple blocks BLK.

The circuit configuration of the memory cell array 10 is not limited to the above-described configuration. For example, the number of string units SU that each block BLK includes and the number of memory cell transistors MT and selection transistors ST1 and ST2 that each NAND string NS includes can be designed to an optional number. The number of word lines WL and the selection gate lines SOD and SGS can be changed based on the number of memory cell transistors MT and selection transistors ST1 and ST2.

1.1.3 Structure of a Memory Cell Array

Figure 3:
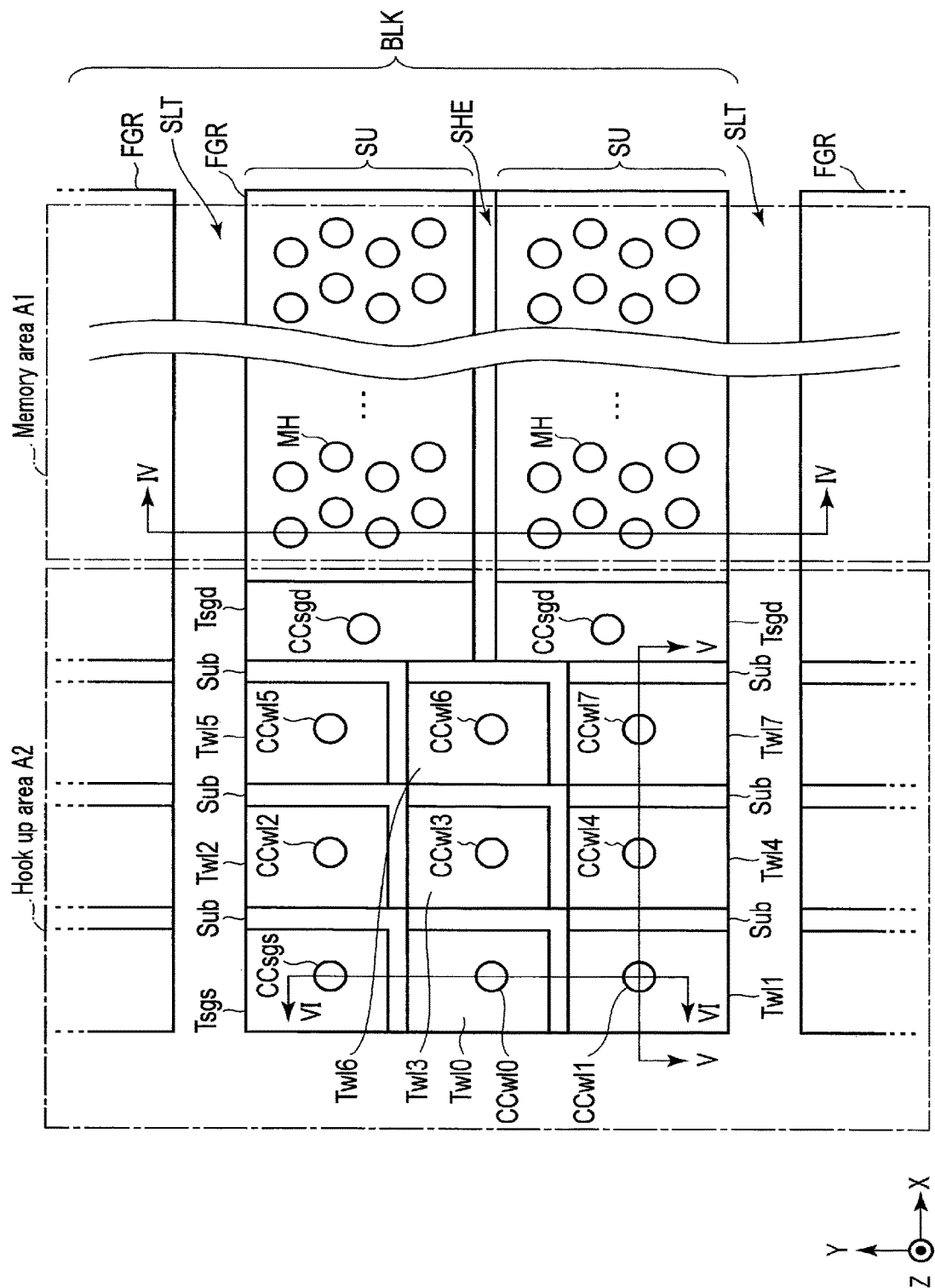
FIG. 3 is a plan view for explaining a configuration of a memory area and a hook-up area of the semiconductor memory according to the first embodiment.

FIG. 3 is a plan view for explaining a structure of the memory cell array of the semiconductor memory according to the first embodiment. FIG. 3 shows a stacked wiring structure including a part of a given block BLK in the memory cell array 10. The stacked wiring structure shown in FIG. 3 includes a memory area A1 and a hook-up area (wiring hook-up area) A2 and an insulating film covering an upper surface for the memory area A1 and the hook-up area A2 is omitted. In the following explanation, a surface of a substrate stacked with various wirings configuring the memory cell array 10 will be known as the XY plane. The X axis and Y axis are axes mutually intersecting a plane along the substrate and correspond to a drawing direction of respective word line WL and the bit line BL. The Z axis is in a direction vertical to the XY plane and corresponds to a stacking direction of the stacked wiring structure.

The memory area A1 is an area that in effect retains data, and a plurality of memory cell transistors MT are provided in the memory area A1. The hook-up area A2 is an area that is provided with, for example, various wirings SGD, WL, SGS, and contact plugs CC for connecting between gates of the memory cell transistor MT provided in the memory area A1 and a row decoder 15.

As shown in FIG. 3, one block BLK includes a plurality of fingers FGR. The finger FGR is provided, for example, extending in the X direction and is aligned in the Y direction. A slit SLT is formed between adjacent fingers FGR. The slit SLT is embedded with, for example, a non-illustrated insulation film.

In the finger FGR, for example, two string units SU are provided aligned in the Y direction. The string unit SU includes a plurality of semiconductor pillars MH in the memory area A1. One semiconductor pillar MH corresponds to, for example, one NAND string NS.

In addition, the string unit SU in the hook-up area A2 is formed with terrace area T (Tsgd, Twl0 to Twl7, and Tsgs) where an upper surface of each of the selection gate lines SGD, the word lines WL0 to WL 7, and the selection gate line SGS are exposed. In the example of FIG. 3, the terrace area T is lined with a row of terrace areas Tsgd, a row of terrace areas Twl 5 to Twl 7, a row of terrace areas Twl2 to Twl4, and a row of terrace areas Tsgs, Twl0 and Twl 1 along the X direction. The terrace areas Twl 5 to Twl 7 are lined along the Y direction in this order. The terrace areas Twl2 to Twl 4 are lined along the Y direction in this order. The terrace areas Tsgs, Twl0 and Twl1 are lined along the Y direction in this order.

A sub-trench Sub that separates each terrace areas T in the XY plane is provided in a space between each of the terrace area Tsgd, Twl0 to Twl 7 and Tsgs. Furthermore, the sub-trench Sub in the present embodiment is a different concept from the hereinafter described trenches, and indicates a groove (opening) formed on one film by a process that does not include for example, lithography. An upper surface of the terrace areas Tsgd, Twl0 to Twl 7 and Tsgs are respectively provided with a plurality of contact plugs CC (CCsgd, CCwl0 to CCwl7 and CCsgs). With regards to the contact plug CC, conductive materials such as silicon doped with phosphorous (P) and tungsten (W) etc. are applicable.

In the same finger FGR, a slit SHE is formed between the memory area A1 of the two adjacent string units SU and between the terrace areas Tsgd. The slit SHE is embedded with, for example, a non-illustrated insulating film. By such structure, each of the selection gate lines SOD connected to the two adjacent string units SU are mutually insulated. Thus, the two string units SU in the same finger FGR are provided with different contact plugs CCsgd on an upper surface of each of the terrace areas Tsgd. On the other hand, the two string units SU in the same finger FGR share, for example, the same terrace areas Twl0 to Twl7 and Tsgs as well as the same contact plugs CCwl0 to CCwl7 and CCsgs.

Figure 4:
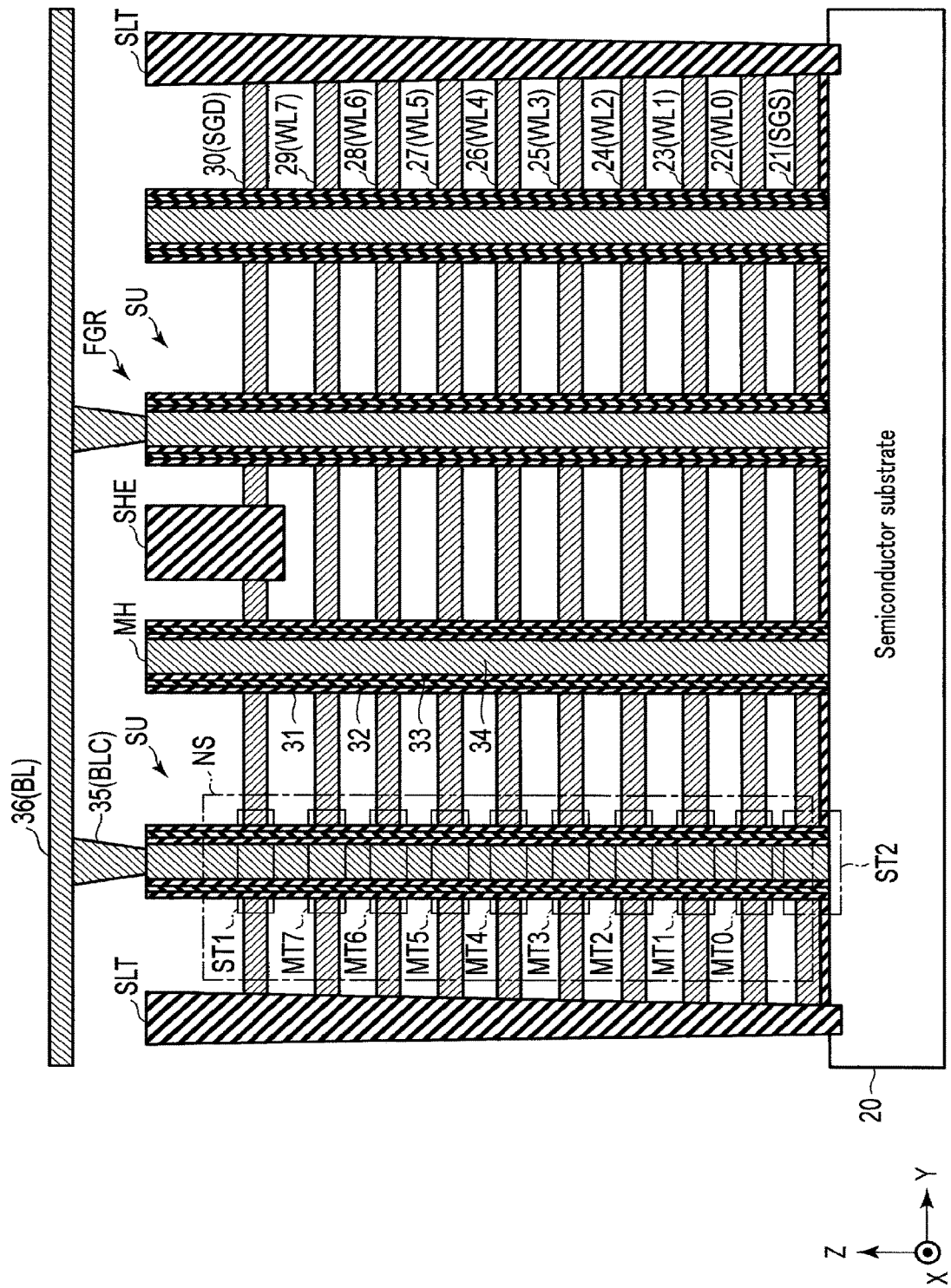
FIG. 4 is a cross-sectional view for explaining a configuration of the memory area of the semiconductor memory according to the first embodiment.

FIG. 4 is a cross-sectional view for explaining the structure of the memory area of the semiconductor memory according to the first embodiment. Specifically, FIG. 4 illustrates one example of a cross-sectional structure along IV-IV lines in the memory area A1 illustrated in FIG. 3. More specifically, FIG. 4 illustrates an example of a cross-sectional structure of four NAND strings NS provided on two string units SU in the same finger FGR along the Y direction. The insulator (interlayer dielectric) provided between the word lines WL is suitably omitted in FIG. 4.

Conductors 21 to 30 are sequentially provided through the insulator on the upper part of a semiconductor substrate 20 in the memory area A1 as illustrated in FIG. 4. The conductors 21 to 30 are formed in a plate spreading in the X direction and Y direction. The conductors 21, 22 to 29, and 30 respectively function as selection gate line SGS, word lines WL0 to WL7 and selection gate line SGD.

A plurality of semiconductor pillars MH are provided, for example, to pass through the conductors 21 to 30 in order to reach an upper surface of the semiconductor substrate 20 from an upper surface of the conductor 30. The semiconductor pillar MH includes, for example, a block insulation film 31, an insulation film 32, a tunnel oxide film 33 and a conductive semiconductor film 34. The block insulation film 31 is provided on an inner wall of a memory hole for forming the semiconductor pillar MH, the insulation film 32 is provided on an inner wall of the block insulation film 31, the tunnel oxide film 33 is provided on an inner wall of the insulation film 32, and the semiconductor film 34 is embedded on an inner side of the tunnel oxide film 33. Different material films can also be additionally formed in the semiconductor film 34.

In the configuration of such semiconductor pillar MH, the insulation film 32 functions as a charge storage layer (a charge storage portion) of the memory cell transistors MT, and a channel of the NAND string NS is formed in the semiconductor film 34. The portions intersecting the semiconductor pillars MH and the conductor 21 function as the selection transistor ST2, the portions intersecting the semiconductor pillars MH with conductors 22 to 29 function as the memory cell transistors MT0 to MT7 respectively, and the portions intersecting the semiconductor pillars MH and the conductor 30 function as the selection transistor ST1.

A conductive contact plug 35 is provided on the semiconductor pillar MH. A conductor 36 functioning as a bit line BL is provided on the contact plug 35. The conductor 36 is formed in a line extending in the Y direction. One conductor 36 is commonly and electrically connected to one semiconductor pillar MH in each string unit SU.

The slit SHE is provided for example, between different string units SU in the same finger FGN from a position of not contacting the lower surface of the conductor 36 until it passes through the conductor 30 and does not contact the upper surface of the conductor 29. By such structure, the conductor 30 is electrically disconnected for every string unit SU by the slit SHE. In addition, the string units SU in a different finger FGR can be mutually differentiated by the slit SLT. The slit SLT is provided, for example, from a position of not contacting the lower surface of the conductor 36 to reaching the semiconductor substrate 20 by passing through the conductors 21 to 30. By such structure, the conductors 21 to 29 are physically disconnected along the Y-direction by the slit SLT.

The structure illustrated in FIG. 4 is only an example and other structures are also applicable. For example, a conductor (not illustrated) functioning as a source line SL can be additionally provided between the semiconductor substrate 20 and the conductor 21 shown in FIG. 4. A stacked structure configured with peripheral circuits (not illustrated) functioning as a row decoder 15 and a sense amplifier 16 can be further provided between the aforementioned conductor and the semiconductor substrate 20. In this case, the slit SLT is provided to, for example, reach a conductor (not illustrated) functioning as a source line SL.

Figure 5:
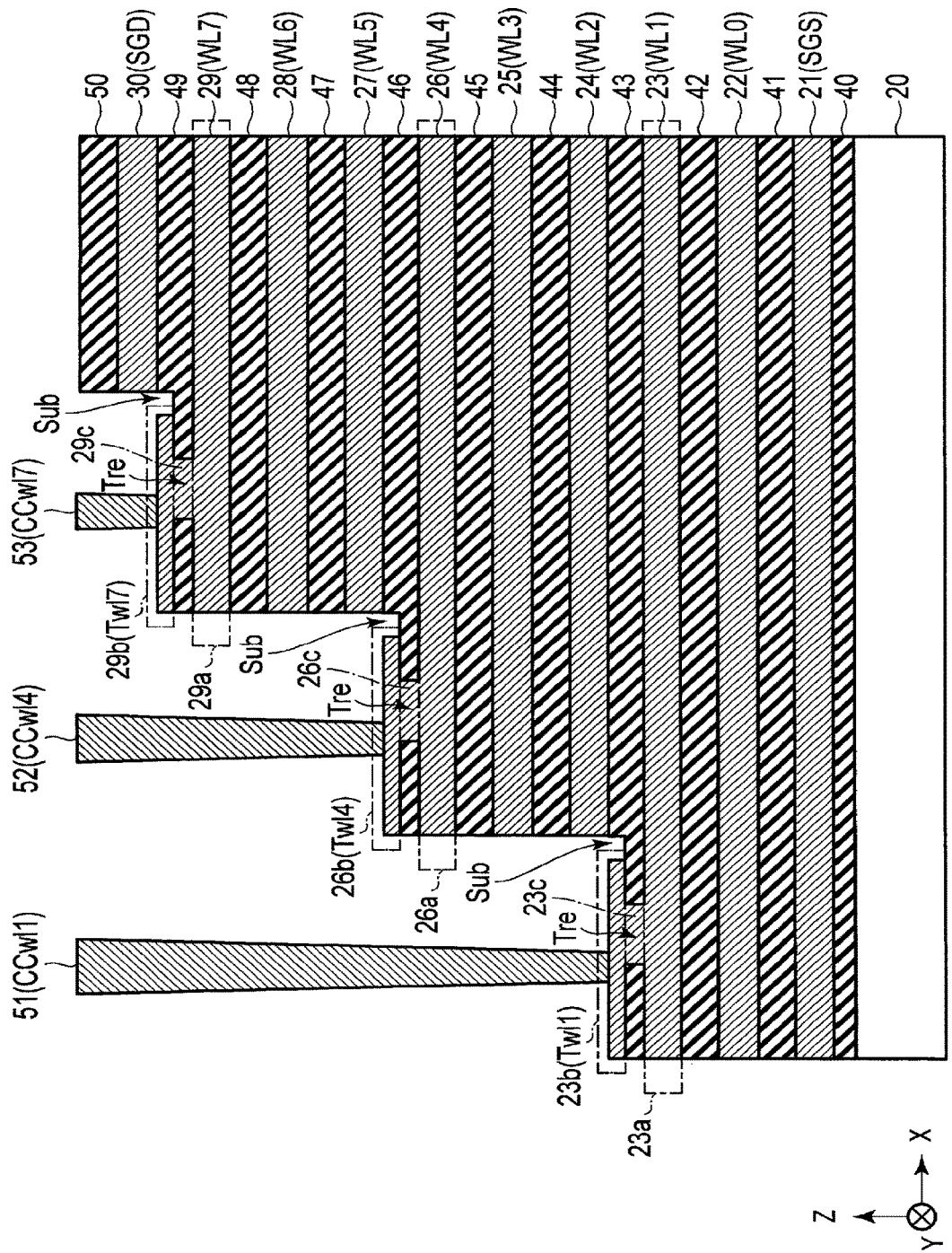
FIG. 5 is a cross-sectional view for explaining a configuration of the hook-up area of the semiconductor memory according to the first embodiment.
Figure 6:
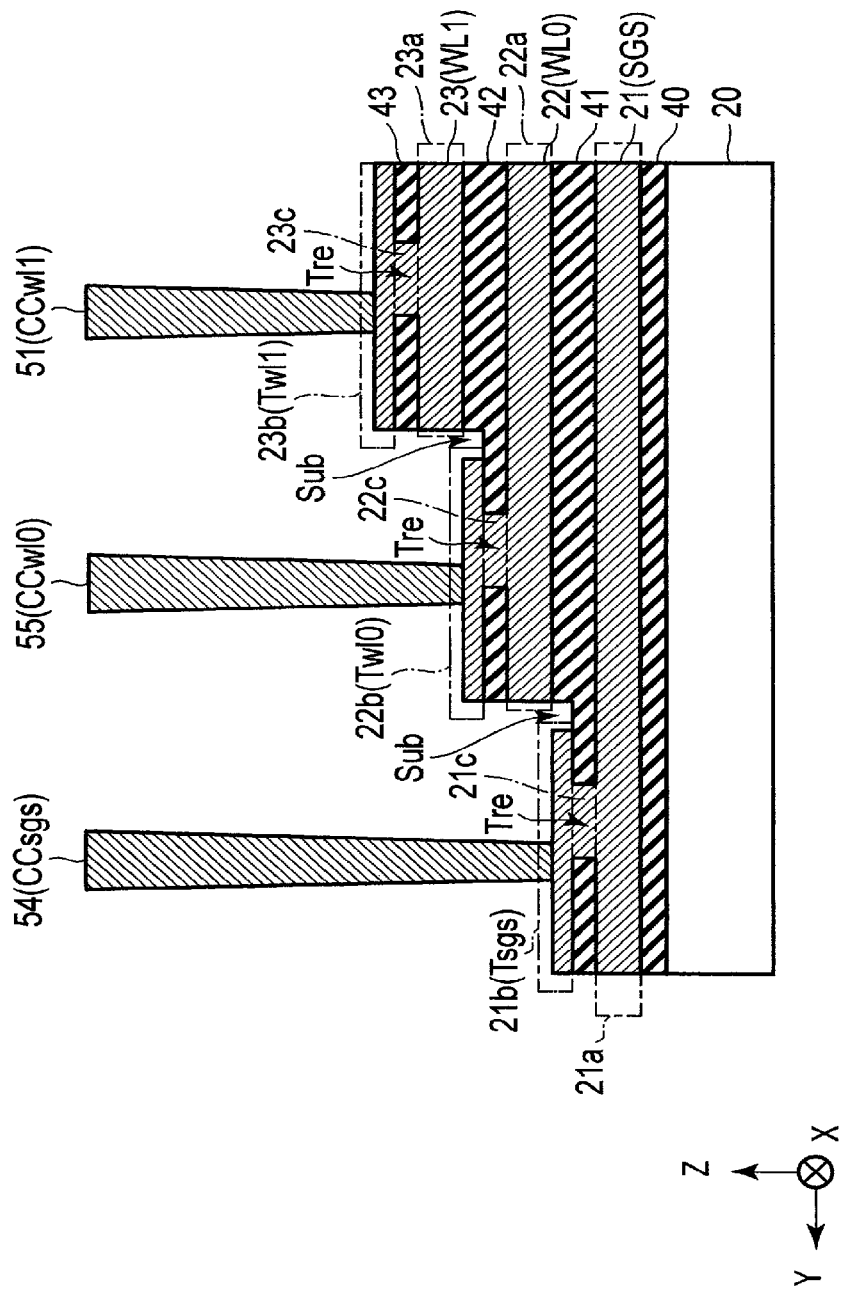
FIG. 6 is a cross-sectional view for explaining a configuration of the hook-up area of the semiconductor memory according to the first embodiment.

FIGS. 5 and 6 are cross-sectional views for explaining the structure of the hook-up area of the semiconductor memory according to the first embodiment. Specifically, FIGS. 5 and 6 respectively illustrate an example of a cross-sectional structure along the V-V line and VI-VI line for the hook-up area A2 illustrated in FIG. 3. More specifically, FIG. 5 illustrates a cross-sectional view along the X-direction of terrace areas Twl1, Twl4, and Twl7 in the same finger FGR, and contact plugs CCwl1, CCwl4, and CCwl7 respectively provided on the upper surfaces of each terrace area. FIG. 6 illustrates a cross-sectional view along the Y-direction of terrace areas Tsgs, Twl0, and Twl1 in the same finger FGR, and contact plugs CCsgs, CCwl0, and CCwl1 respectively provided on the upper surfaces of each terrace area. FIGS. 5 and 6 illustrate an interlayer dielectric in the stacked wiring structure that is not illustrated in FIG. 4.

As shown in FIG. 5, an insulator 40 is provided between the semiconductor substrate 20 and the conductor 21. Similarly, insulators 41 to 49 are respectively provided between each layer of conductors 21 to 30. An insulator 50 is provided on the conductor 30.

The conductors 21 to 30 and the insulators 41 to 50 are stacked stepwise, having at least three steps along V-V line. In the aforementioned stepwise stacked structure, for example, terrace areas Twl1, Twl4, and Twl7 are respectively provided on the upper surface of a terrace of a first to third steps. The terrace areas Twl1, Twl4, and Twl7 respectively included in conductors 23, 26, and 29.

The conductor 23 includes a first portion 23a positioned on a lower part of the insulator 43, a second portion 23b positioned on an upper part of the insulator 43, and a third portion 23c electrically connected to the first portion 23a and the second portion 23b. In other words, the first portion 23a of the conductor 23 is a portion interposed between an upper surface of the insulator 42 and a lower surface of the insulator 43, and corresponds to a base portion in the stepwise stacked structure. The second portion 23b of the conductor 23 corresponds to the terrace area Twl1 provided on the upper surface of the insulator 43. The third portion 23c of the conductor 23 corresponds to a conductor embedded in a trench Tre partially provided on the insulator 43. The trench Tre in the present embodiment is, for example, of a different concept than the aforementioned sub-trench Sub, and indicates a groove (opening) formed by a process including lithography.

Similarly, a conductor 26 includes a first portion 26a positioned on the lower part of an insulator 46, a second portion 26b positioned on an upper part of the insulator 46, and a third portion 26c electrically connected to the first portion 26a and the second portion 26b. In other words, the first portion 26a of the conductor 26 is a portion interposed between an upper surface of the insulator 45 and a lower surface of the insulator 46, and corresponds to a base portion in the stepwise stacked structure. The second portion 26b of the conductor 26 corresponds to the terrace area Twl4 provided on the upper surface of the insulator 46. The third portion 26c of the conductor 26 corresponds to a conductor embedded in a trench Tre partially provided on the insulator 46.

In addition, a conductor 29 includes a first portion 29a positioned on a lower part of an insulator 49, a second portion 29b positioned on the upper part of the insulator 49, and a third portion 29c electrically connected to the first portion 29a and the second portion 29b. In other words, the first portion 29a of the conductor 29 is a portion interposed between an upper surface of an insulator 48 and a lower surface of the insulator 49 and corresponds to a base portion in the stepwise stacked structure. The second portion 29b of the conductor 29 corresponds to the terrace area Twl7 provided on the upper surface of the insulator 49. The third portion 29c of the conductor 29 corresponds to a conductor embedded in a trench Tre partially provided on the insulator 49.

The terrace areas Twl1, Twl4, and Twl7 are respectively disconnected from a side surface including conductors 24 to 26, a side surface including conductors 27 to 29, and a side surface including conductor 30 in a step structure along the X direction by the sub-trench Sub. Each of the upper surfaces of the terrace area Twl1, Twl4, and Twl7 are respectively provided with conductors 51 to 53 functioning as contact plugs CCwl1, CCwl4, and CCwl7.

FIG. 5 explains a stacked structure in a cross section along the terrace areas Twl1, Twl4, and Twl7 of the cross sections along the X direction of the stepwise stacked structure and a similar step structure is formed for a cross section along other terrace areas T. In other words, the cross section along terrace areas Twl0, Twl3, and Twl6 form a step structure where terrace areas Twl0, Twl3, and Twl6 are provided on the upper surfaces of the first to third steps of the terrace. Each of the terrace areas Twl0, Twl3, and Twl6 corresponds to a second portion (not illustrated) of conductors 22, 25, and 28. The cross section along the terrace areas Tsgs, Twl2, and Twl5 forms a step structure that is respectively provided with terrace areas Tsgs, Twl2, and Twl5 on the upper surfaces of the first to third steps of the terrace. The terrace areas Tsgs, Twl2, and Twl5 respectively correspond to a second portion (not illustrated) of conductors 21, 24, and 27.

As shown in FIG. 6, the conductors 21 to 23 and the insulators 41 to 43 are stacked stepwise having at least three steps along VI-VI line. The aforementioned stepwise stacked structure is, for example, respectively provided with terrace areas Tsgs, Twl0, and Twl1 on the upper surfaces of a first to third steps. The terrace areas Tsgs, Twl0, and Twl1 are respectively included in conductors 21, 22, and 23.

The conductor 21 includes a first portion 21a positioned on a lower part of an insulator 41, a second portion 21b positioned on an upper part of the insulator 41, and a third portion 21c for electrically connecting to the first portion 21a and the second portion 21b. In other words, the first portion 21a of the conductor 21 is a portion interposed between an upper surface of an insulator 40 and a lower surface of the insulator 41 and corresponds to a base portion in the stepwise stacked structure. The second portion 21b of the conductor 21 corresponds to terrace area Tsgs provided on the upper surface of the insulator 41. The third portion 21c of the conductor 21 corresponds to a conductor embedded in a trench Tre partially provided on the insulator 41.

Similarly, the conductor 22 includes a first portion 22a positioned on a lower part of an insulator 42, a second portion 22b positioned on an upper part of the insulator 42, and a third portion 22c for electrically connecting to the first portion 22a and the second portion 22b. In other words, the first portion 22a of the conductor 22 is a portion between an upper surface of an insulator 41 and a lower surface of the insulator 42, and corresponds to a base portion in the step stack structure. The second portion 22b of the conductor 22 corresponds to a terrace area Twl0 provided on the upper surface of the insulator 42. The third portion 22c of the conductor 22 corresponds to a conductor embedded in a trench Tre partially provided on the insulator 42.

The terrace areas Tsgs and Twl0 are respectively separated from a side surface including the conductor 22 and the side surface including the conductor 23 in a stepwise stacked structure along Y direction by the sub-trench Sub. Conductors 54 and 55 functioning as contact plugs CCsgs and CCwl0 are respectively provided on the upper surfaces of terrace areas Tsgs and Twl0.

FIG. 6 explains the stacked structure in a cross section along the terrace areas Tsgs, Twl0, and Twl1 of the cross sections along the Y direction of the stepwise stacked structure, and a similar step structure is formed for a cross section along other terrace areas T. In other words, the cross section along terrace areas Twl2 to Twl4 are formed with a step structure that is respectively provided with terrace areas Twl2 to Twl4 on the upper surface of the first to third steps of the terrace. The terrace areas Twl2 to Twl4 respectively correspond to a second portion (not illustrated) of conductors 24 to 26. Also, in the cross section along terrace areas Twl5 to Twl7, a step structure where the terrace areas Twl5 to Twl7 are respectively provided on the upper surface of the first to third steps of the terrace is formed. The terrace areas Twl5 to Twl7 respectively correspond to a second portion (not illustrated) of conductors 27 to 29.

From the above configuration, each of the conductors 21 to 29 are electrically connected to contact plugs CCsgs and CCwl0 to CCwl7 through terrace areas Tsgs and Twl0 to Twl7, respectively.

1.2 Manufacturing Method of Semiconductor Memory

Next, a method of manufacturing a semiconductor memory according to the first embodiment is described.

Figure 12:
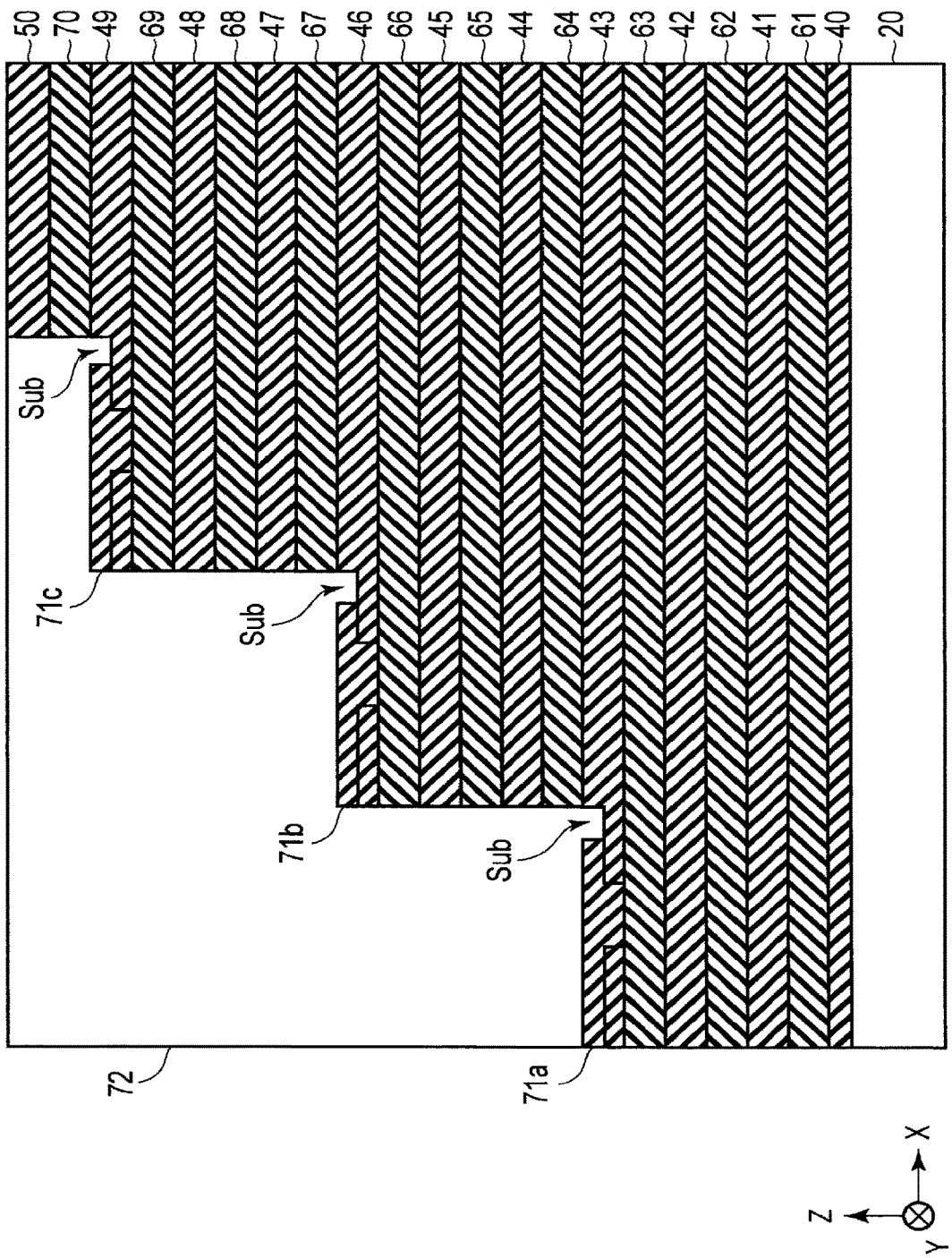
FIG. 12 is a cross-sectional view for explaining a manufacturing method of the semiconductor memory according to the first embodiment.
Figure 13:
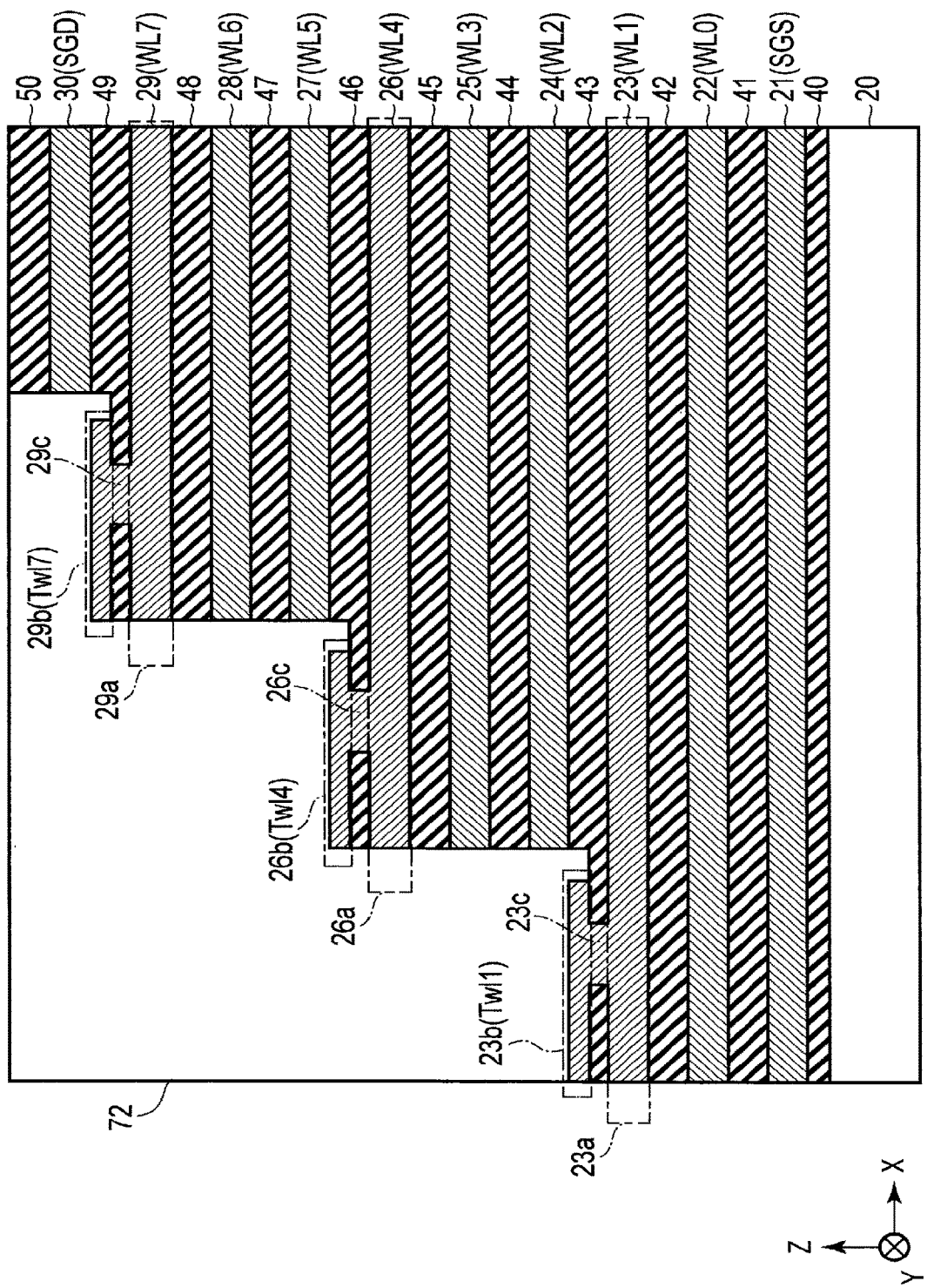
FIG. 13 is a cross-sectional view for explaining a manufacturing method of the semiconductor memory according to the first embodiment.
Figure 14:
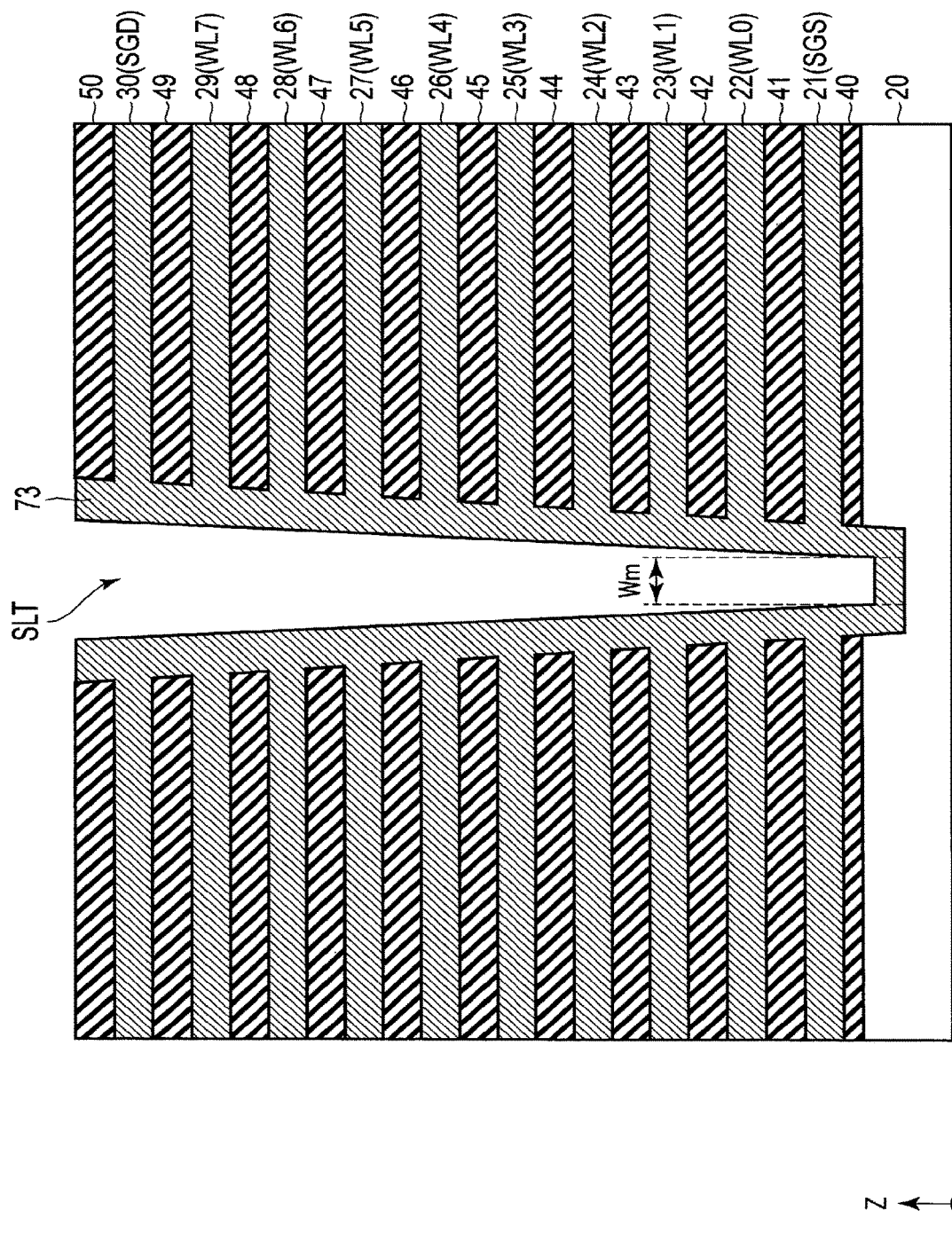
FIG. 14 is a cross-sectional view for explaining a manufacturing method of the semiconductor memory according to the first embodiment.
Figure 15:
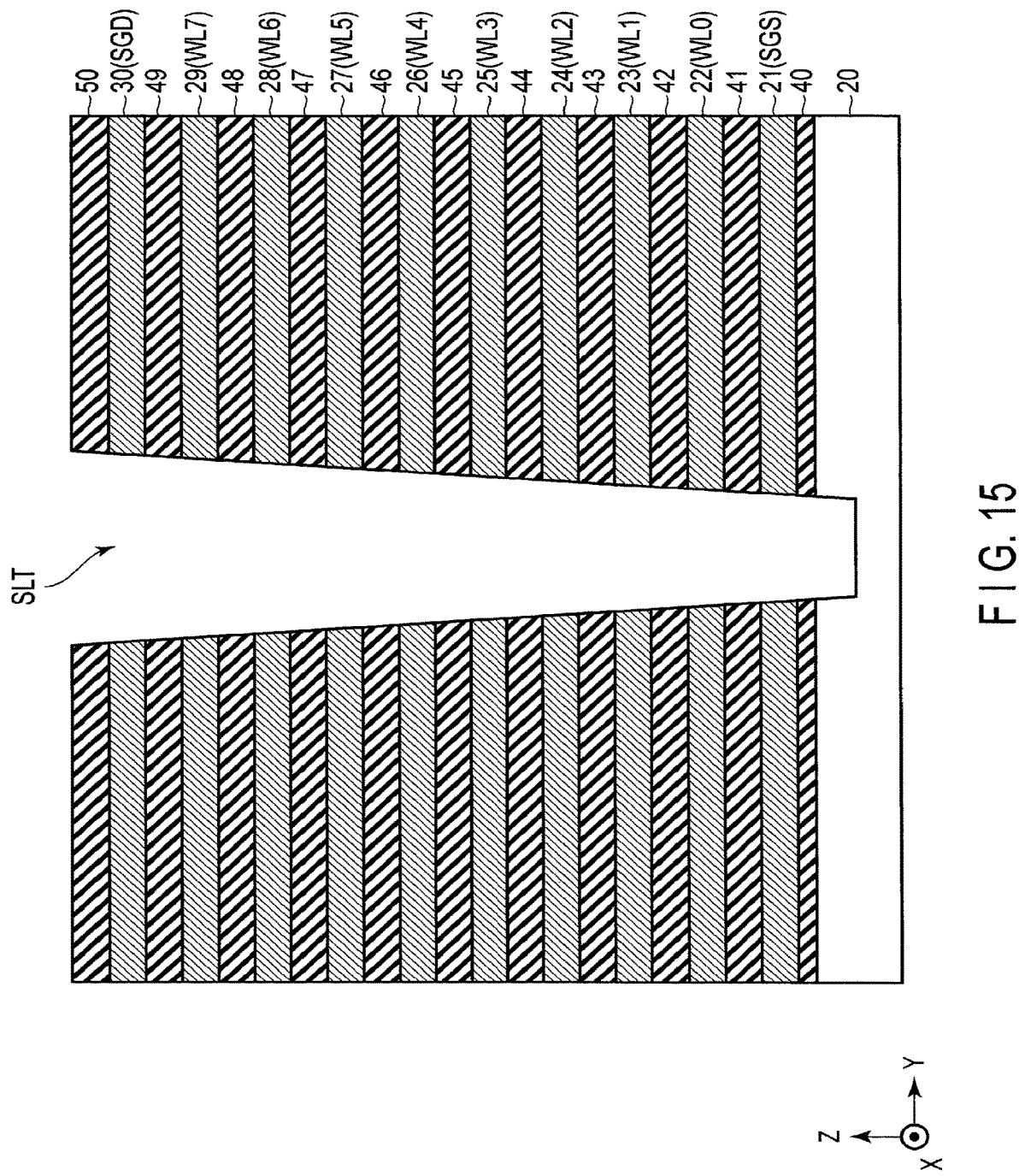
FIG. 15 is a cross-sectional view for explaining a manufacturing method of the semiconductor memory according to the first embodiment.

FIGS. 7 to 16 show an example of a cross-sectional structure of the stacked structure in the manufacturing process of a semiconductor memory 1. The following describes the processes from a process of stacking replacement materials for forming word lines WL, etc, and insulators to a process of forming contact plugs CC on terrace areas T. Specifically, FIGS. 7 to 13 and 16 illustrate a cross section of a hook-up area A2 obtained along V-V line in FIG. 3, and FIGS. 14 and 15 illustrate a cross section of slit SLT obtained along a part of the IV-IV line in FIG. 3.

First, an insulator 40 is stacked on an upper part of a semiconductor substrate 20. Replacement materials 61 to 70 and insulators 41 to 50 are alternately stacked throughout the entire memory area A1 and hook-up area A2 on the insulator 40. Nitride film such as silicon nitride (SiN) etc. are used in replacement materials 61 to 70 and oxide film such as silicon dioxide ($SiO_2$) etc. are used in insulators 40 to 50. The number of layers that replacement materials 61 to 70 form corresponds to, for example, the number of lines of selection gate line SGS, word lines WL and the selection gate line SGD.

Figure 7:
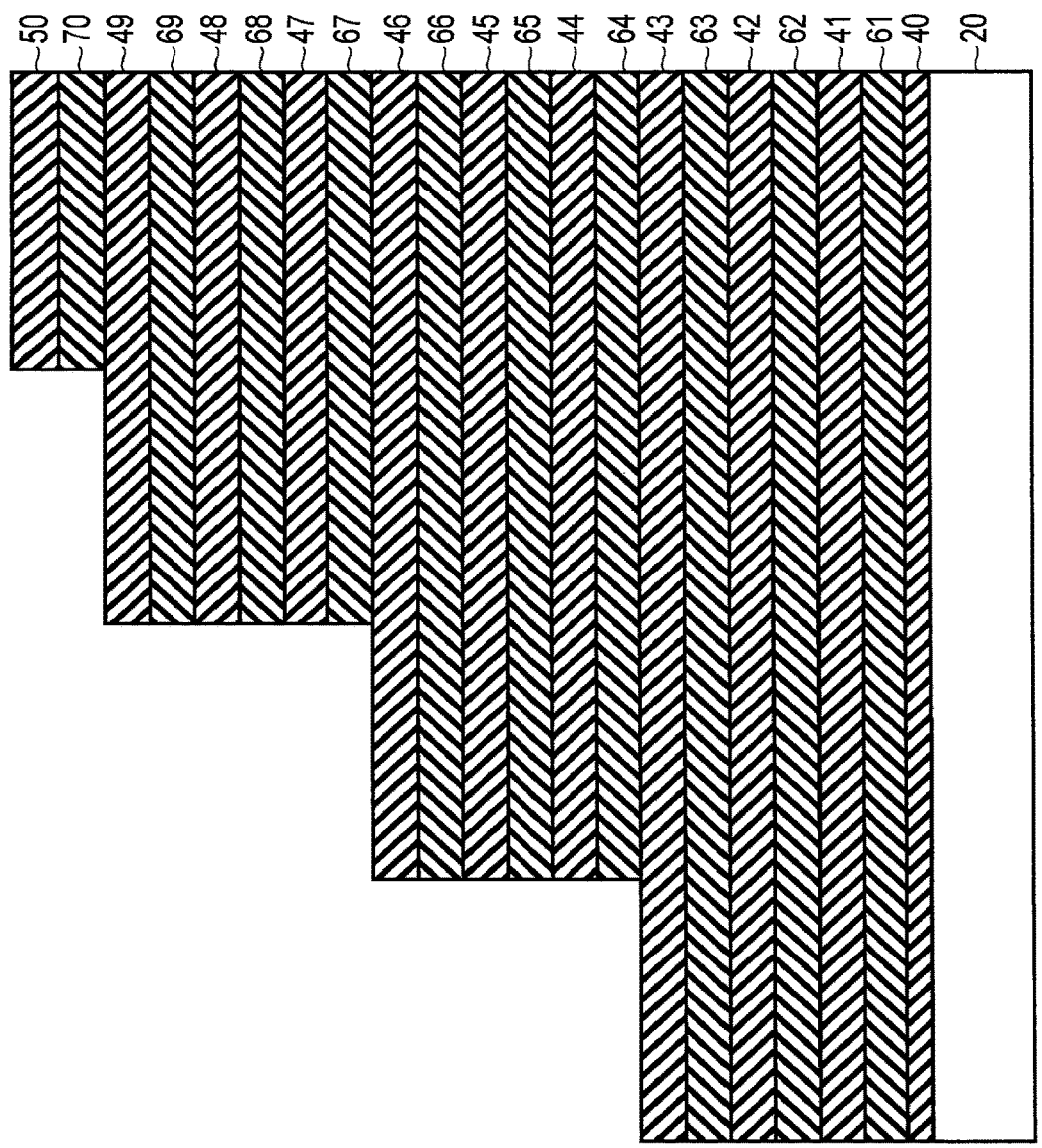
FIG. 7 is a cross-sectional view for explaining a manufacturing method of the semiconductor memory according to the first embodiment.

Next, as shown in FIG. 7, the stacked structure of the replacement materials 61 to 70 and insulators 41 to 50 are formed in step shapes in the hook-up area A2. Specifically, in the aforementioned stepwise stacked structure, the insulator 43 forms an upper surface of a first step of a terrace, the insulator 46 forms an upper surface of a second step of a terrace, and the insulator 49 forms an upper surface of a third step of a terrace along the V-V line.

A non-illustrated mask is provided, for example, throughout the entire hook-up area A2 on the upper surface of the insulator 50 in order to form the above step structure. Next, after forming a pattern on the mask by lithography, an anisotropic etching performed on the stacked structure based on the obtained pattern, and removing a part of the mask by slimming the pattern of the mask is sequentially repeated. The mask, for example, after removing an area planned to form a terrace of the first step in FIG. 7, is sequentially removed an area planned to form each terrace of the second and third steps. By such structure, the stacked structure can be etched to form a step shape.

Figure 8:
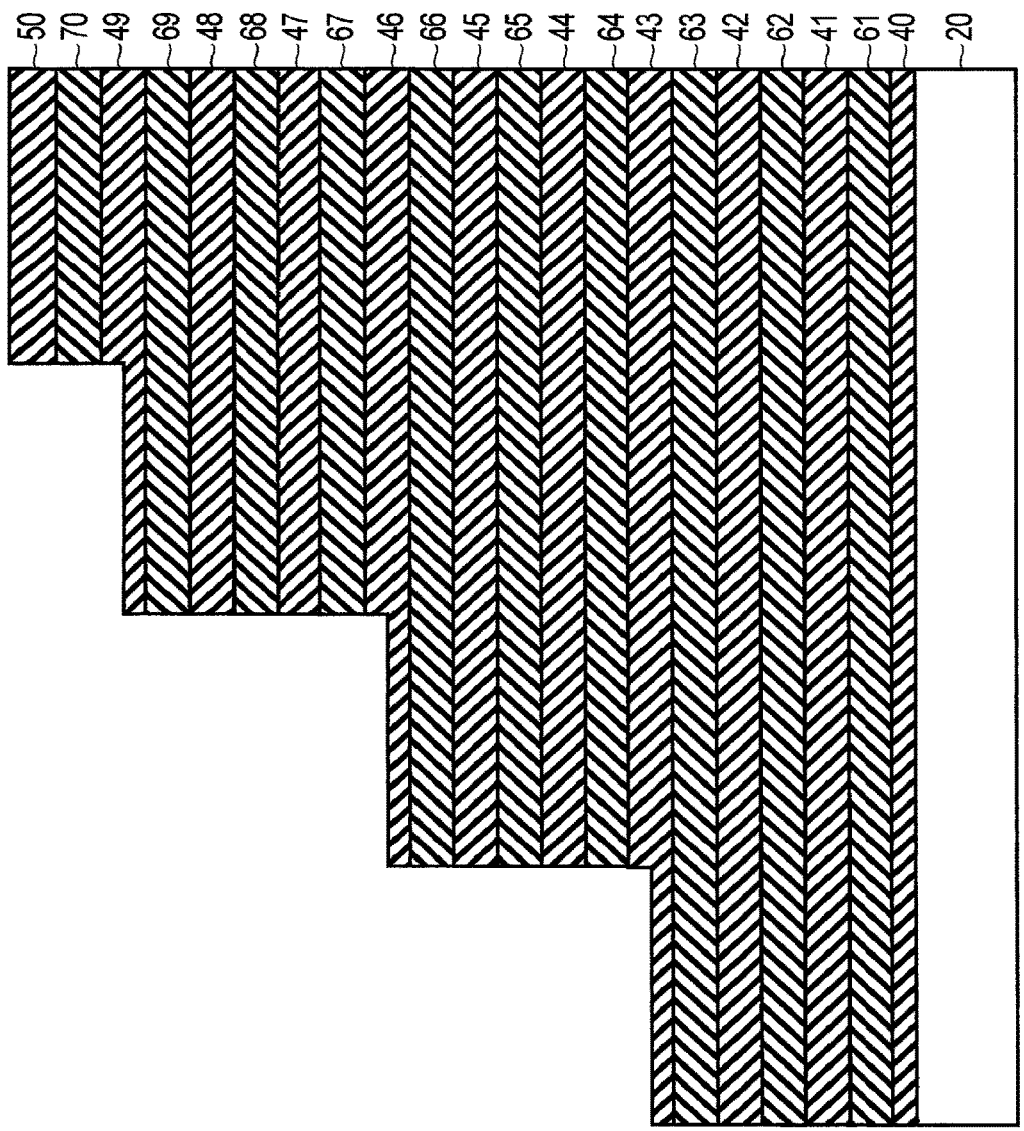
FIG. 8 is a cross-sectional view for explaining a manufacturing method of the semiconductor memory according to the first embodiment.

As shown in FIG. 8, the upper surface of each of the step structured terraces is etched back. For example, a thickness of insulators 43, 46, and 49 in the upper surface of each terrace is reduced to about half of a thickness of insulators 43, 46, and 49 in an area where the replacement materials 64, 67, and 70 are provided on the upper surface, respectively. By such structure, the trench Tre can be easily formed in a hereinafter described process.

Figure 9:
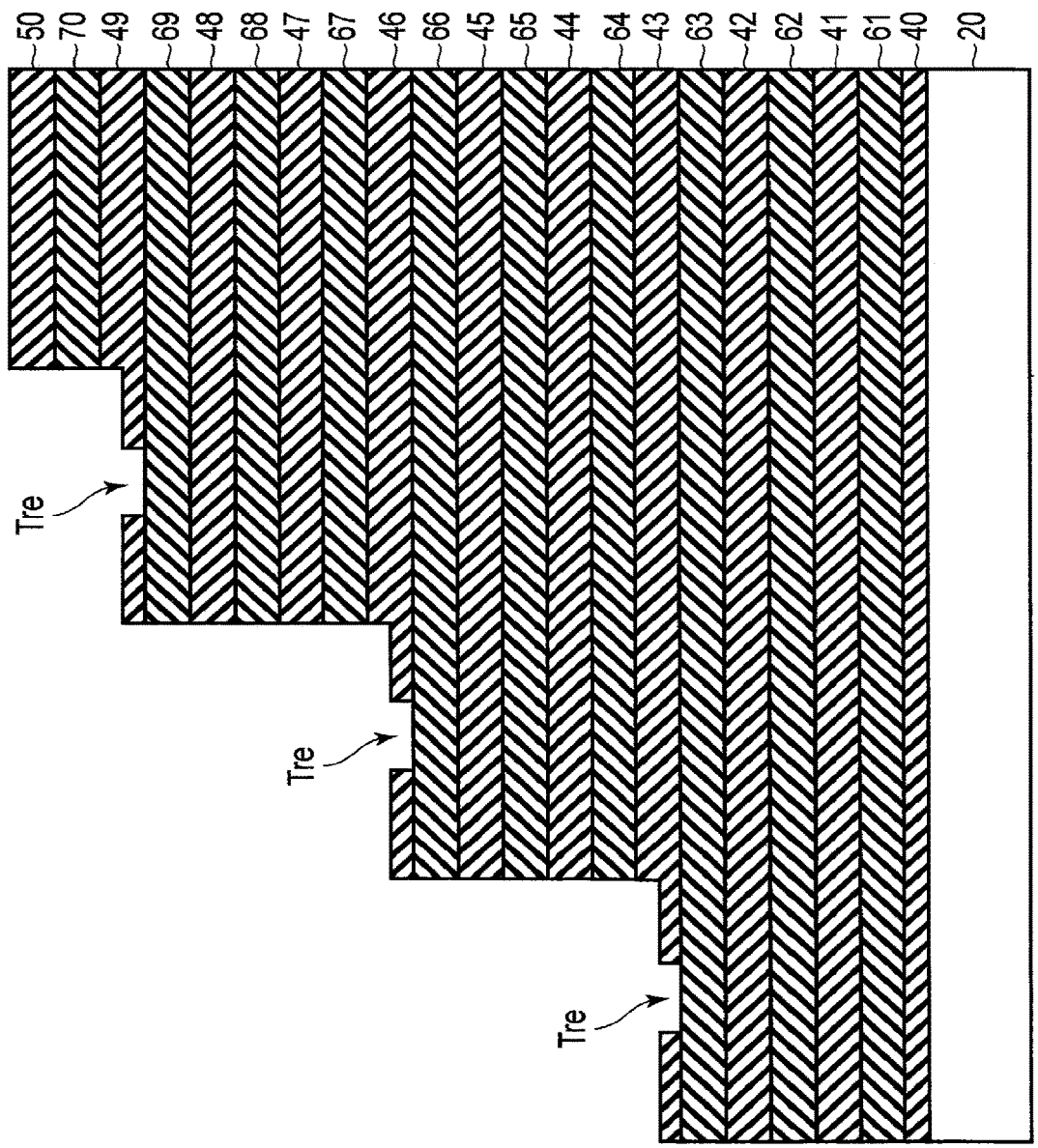
FIG. 9 is a cross-sectional view for explaining manufacturing method of the semiconductor memory according to the first embodiment.

As shown in FIG. 9, a non-illustrated mask is provided on an upper surface of each terrace of the step structure. A groove is formed on the area planned to form a trench Tre by lithography using the mask. By performing the anisotropic etching, trenches Tre are formed on the insulators 43, 46, and 49. The trenches Tre in the terrace of first to third steps of the step structure respectively pass the insulators 43, 46, and 49 to reach the upper surfaces of replacement materials 63, 66, and 69. By such structure, the replacement materials 63, 66, and 69 are respectively exposed in an area where the trench Tre is formed on the upper surface of the terraces of the first to third steps of the step structure.

Figure 10:
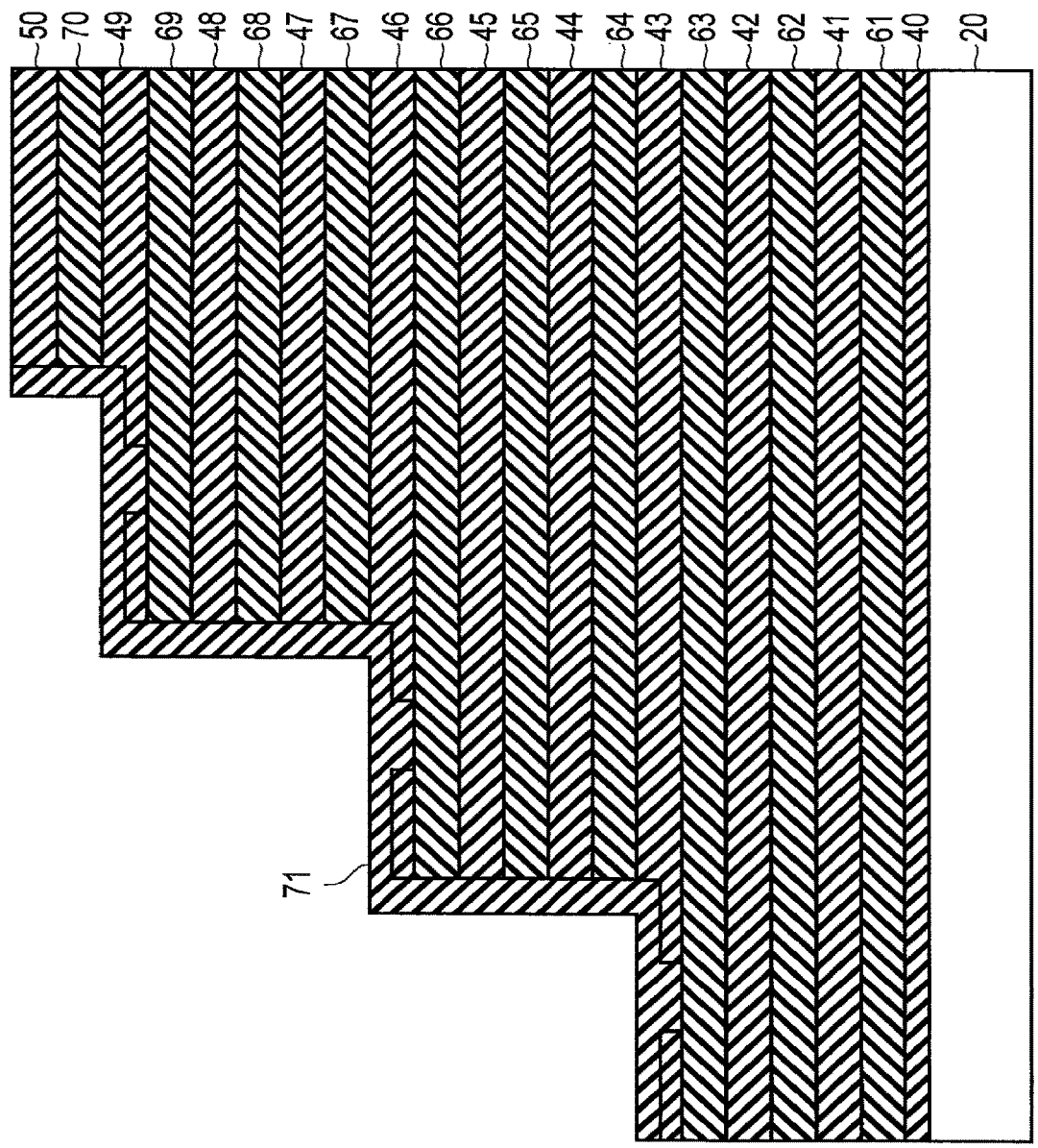
FIG. 10 is a cross-sectional view for explaining a manufacturing method of the semiconductor memory according to the first embodiment.

Then as shown in FIG. 10, a replacement material 71 is provided to cover the upper surface of each terrace of the step structure (including the trench Tre) and side surface of each step. The replacement material 71 includes, for example, a silicon nitride (SiN) and is provided by, for example, plasma enhanced-atomic layer deposition (PE-ALD).

Figure 11:
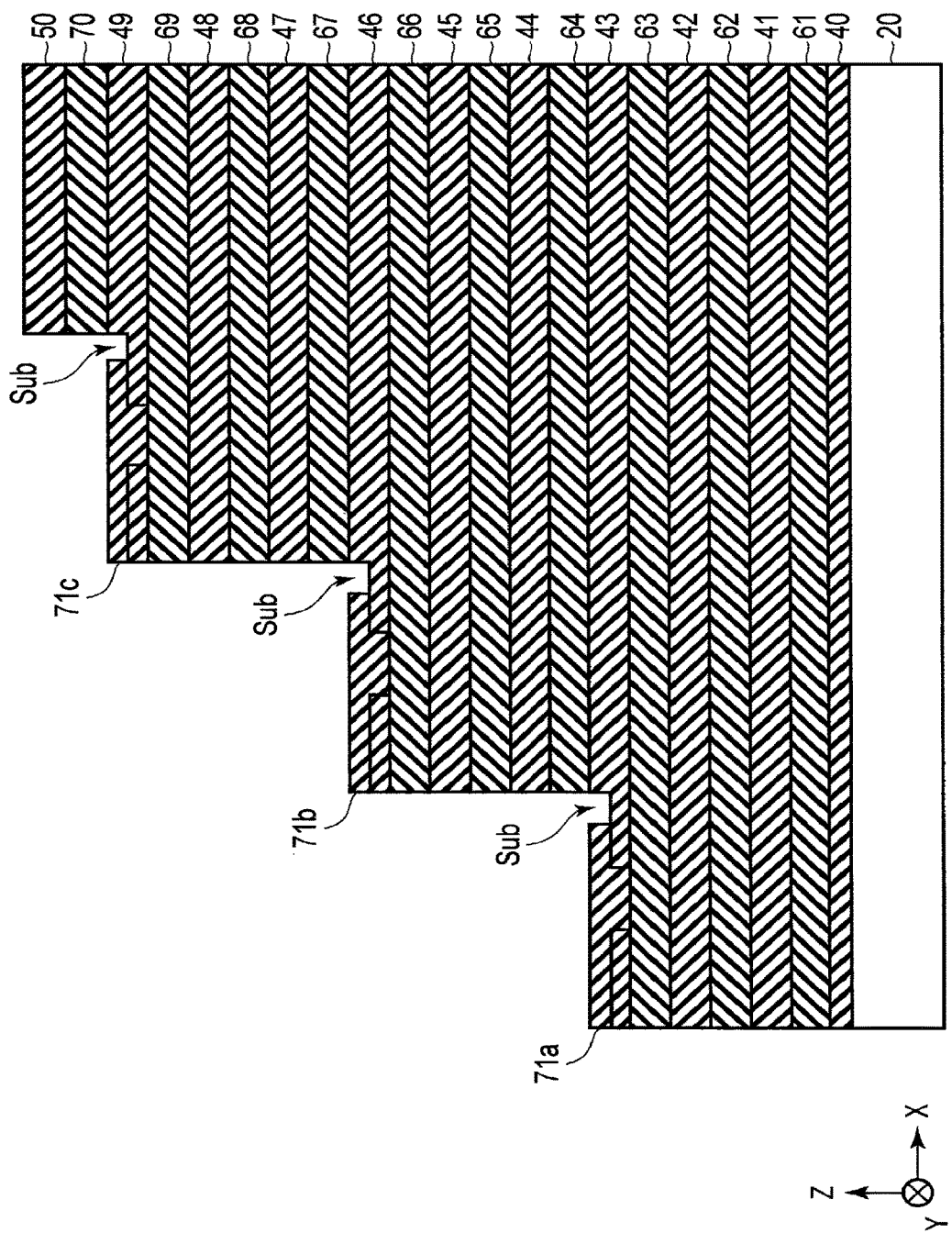
FIG. 11 is a cross-sectional view for explaining a manufacturing method of the semiconductor memory according to the first embodiment.

Next, as shown in FIG. 11, the replacement material 71 provided on the side surface of the step structure is selectively removed. The replacement material 71 has anisotropy so that the selection ratio in the direction along the XY plane (lateral direction) will be larger with respect to wet etching using, for example, hydrogen fluoride (HF). Thus, the replacement material 71 on the side surface of the step structure can be selectively removed by performing the aforementioned wet etching. By such structure, the upper surface of the terrace of the first to third steps are respectively formed with replacement materials 71a, 71b, and 71c on an area separate from the side surface of the step structure. In other words, the sub-trench Sub is formed between each of the replacement materials 71a to 71c and a side surface of the step structure.

The removing of the replacement material 71 provided on the side surface and the generation of the sub-trench Sub described in FIG. 11 can also be achieved by dry etching. Specifically, for example, anisotropic etching of the replacement material 71 can be carried out after providing the non-illustrated mask in an area, of the replacement material 71, excluding a part provided on the side surface of the step structure. By such structure, the replacement material 71 provided on the side surface of the step structure can be selectively removed.

Next, an insulator 72 is provided to cover the step structure as shown in FIG. 12. The insulator 72 includes, for example, DTEOS (silicon oxide formed from TEOS (Tetraethyl ortho-silicate) by plasma CVD (chemical vapor deposition)).

Then, the replacement materials 61 to 70 and 71a to 71c are replaced with the conductors 21 to 30 as shown in FIG. 13. The replacement materials 61 to 70 and 71a to 71c are all nitride films; and therefore, can be simultaneously removed by wet etching, for example, by taking a greater selection ratio of a nitride film to the insulators 40 to 50 that is an oxide film. From a space caused by removing replacement materials 61 to 70 and 71a to 71c, a film is formed on each of conductors 21 to 30. The conductors 21 to 30 function as selection gate line SGS, word lines WL0 to WL7 and selection gate line SGS.

Specifically, the first portions 21a to 30a of the conductors 21 to 30 are formed in the space formed by removing replacement materials 61 to 70. The second portions 23b, 26b, and 29b of the conductors 23, 26, and 29 are formed in the space formed by removing replacement materials 71a to 71c positioned on the upper part of the insulators 43, 46, and 49 as terrace areas Twl1, Twl4, and Twl7. The third portions 23c, 26c, and 29c of the conductors 23, 26, and 29 are formed in the space formed by removing replacement materials 71a to 71c embedded in the trench Tre of the insulators 43, 46, and 49.

The replacement materials 61 to 70 and 71a to 71c extend in the Y direction and reach the non-illustrated slit SLT. Thus, the removing of the aforementioned replacement material 61 to 70 and 71a to 71c is achieved through a separately formed slit SLT. The film deposition of the conductors 21 to 30 in the space formed by removing the replacement materials 61 to 70 and 71a to 71c is achieved through the slit SLT.

As illustrated in FIG. 14, when the conductors 21 to 30 are embedded through a slit SLT to a space where the replacement materials 61 to 70 and 71a to 71c are removed, a conductive film 73 is formed in the slit SLT. The conductive film 73 can electrically connect to the conductors 21 to 30 in the slit SLT; thus, after the embedding of the conductors 21 to 30 are complete, the conductive film 73 is removed by etching. In the example shown in FIG. 14, the side walls of the slit SLT formed by the conductive film 73 are not connected (the cross-sectional shape of the slit SLT is not a V-shaped and is a trapezoidal shape). Specifically, in FIG. 14, the slit SLT has a blockage margin Wm (>0) along the XY plane at the bottom surface.

Thus, as shown in FIG. 15, the entire bottom surface and side surface of the slit SLT can be etched when etching the conductive film 73. Therefore, the conductive film 73 in the slit SLT can be removed entirely and can prevent the conductors 21 to 30 from being electrically connected.

Figure 16:
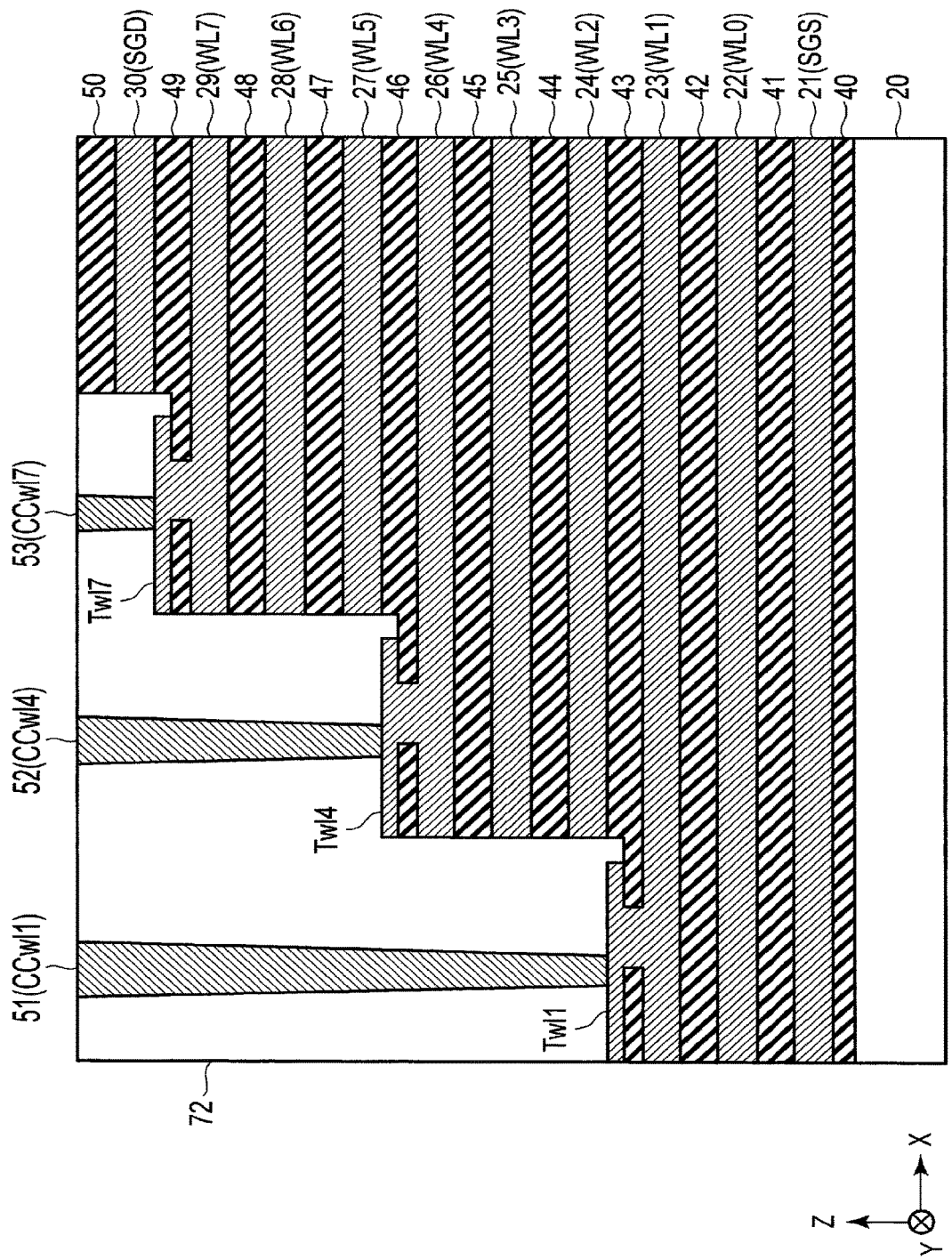
FIG. 16 is a cross-sectional view for explaining a manufacturing method of the semiconductor memory according to the first embodiment.

Next, as shown in FIG. 16, a contact holes corresponding to contact plugs CC are processed by performing lithography and anisotropic etching. The contact holes are, for example, collectively opened by anisotropic etching which can largely take the selection ratio of an insulator 72 to the conductors 21 to 30. In an example of FIG. 16, the contact holes are collectively formed to expose terrace areas Twl1, Twl4, and Twl7. Then conductors 51 to 53 are embedded in the contact holes and contact plugs CCwl1, CCwl4, and CCwl7 are formed.

By the above described manufacturing process, the hook-up area A2 of the memory cell array 10 of the semiconductor memory 1 and the contact plugs CC for supplying voltage to word lines WL etc. in the hook-up area A2 are formed. The above described manufacturing process is only one example, and other processes can be inserted between the processing of each process. For example, the aforementioned example describes the step structure concerning terrace areas Twl1, Twl4 and Twl7; however, a similar processing as the above example is applicable to the step structure concerning other terrace areas Tsgs, Twl0, Twl2, Twl3, Twl5, and Twl6.

1.3 Advantageous Effects According to Present Embodiment

The first embodiment prevents the punch-through of the contact plug. This effect will be described below.

With the increase in the number of stacked layers of word line WL, the depth in Z direction will be significantly different for the contact plug CC connected to the word line WL of the upper layer and the contact plug CC connected to the word line WL of the lower layer. Specifically, the depth of contact plug CCwl0, for example, will be significantly deeper than the depth of the contact plug CCwl7. Thus, when a plurality of contact holes are to be collectively opened, the contact hole corresponding to the word line WL of the upper layer side may punch-through the word line WL of the upper layer side before the contact hole corresponding to word line WL of the lower layer side reaches the word line WL of the aforementioned lower layer side. Thus, the contact plug CC may cause the word lines WL to short out. In order to prevent the short out between the aforementioned word lines WL, it is desirable to thicken the film thickness of the word line WL in the terrace area T connected to the contact plug CC.

On the other hand, thickening the word line WL will result in thickening of the conductive film 73 formed in the slit SLT. If the side walls become connected by making the conductive film 73 in the slit SLT to be thick (the cross-sectional shape of the slit SLT will be V-shaped and when the slit SLT is blocked), the film thickness near the bottom surface of the conductive film 73 will be thicker than the film thickness of the side surface in the slit SLT. When etching the conductive film 73, there is a possibility that the conductive film 73 near the bottom surface of the slit SLT will remain and there is a possibility that the lower stage conductors (for example, conductors 21 and 22) will short out.

Figure 17:
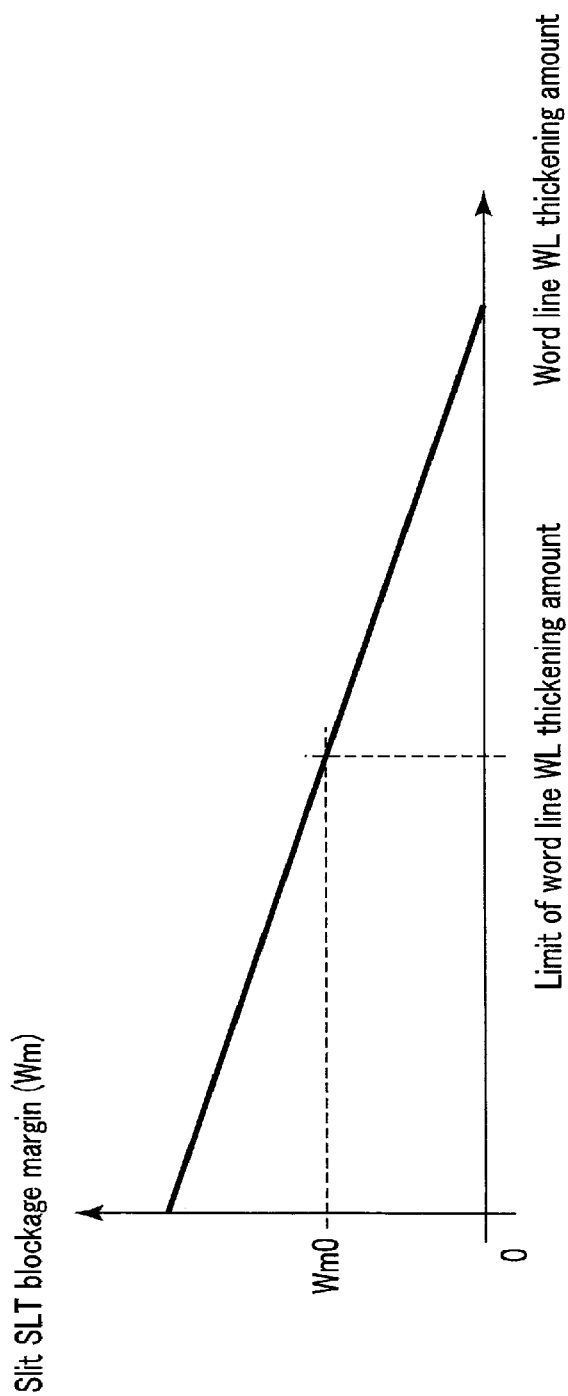
FIG. 17 is a diagram for explaining a general relationship between a word line and a blockage margin of a slit.

FIG. 17 is a diagram for explaining the general relationship between a thickening amount of the word line WL and the blockage margin Wm of the slit SLT. As shown in FIG. 17 when the word line WL is thickened, the blockage margin Wm of the slit SLT decreases. Therefore, the thickening amount when the blockage margin Wm of slit SLT, which can secure a predetermined value Wm0 (>0), will be set as a limit value of the thickening amount of the word line WL so that the word lines WL will not short out due to remaining conductor in the slit SLT.

According to the first embodiment, the hook-up area A2 configuring the portion of the finger FGR includes a stack section where the conductors 21 to 30 that interpose the insulators 41 to 49 are stacked stepwise. The conductors 21 to 30 are electrically disconnected from each other. For example, the conductor 23 includes a first portion 23a, a second portion 23b, and a third portion 23c. The first portion 23a and the second portion 23b are respectively positioned on lower and upper sides of the insulator 43. The third portion 23c electrically connects the first portion 23a and the second portion 23b. By such structure, the conductor 23 will be thickened to not only the film thickness of the first portion 23a, but also to at least the film thickness of the second portion 23b.

The second portion 23b interposes the insulator 43 with the first portion 23a. By such structure, when the conductor 23 forms a film, the first portion 23a and the second portion 23b will form a film simultaneously. In other words, the blockage margin Wm of the slit SLT will not decrease within a range where the thickness of the second portion 23b will not exceed the thickness of the first portion 23a. Thus, the decrease of the blockage margin Wm of the slit SLT, generated in a case where the film thickness is simply made to be thicker without interposing the insulator 43 between the first portion 23a and the second portion 23b, will not be caused and the limit value of the thickening amount of the word line WL for only the thickness of the first portion 23a can be secured. Therefore, on the upper surface of the terrace in the step structure, the effective film thickness of the conductor 23 is increased to a total film thickness of the first portion 23a and the second portion 23b, which will result in preventing the punch-through of the contact plug CC.

The third portion 23c is formed by embedding the trench Tre provided in the insulator 43. The first portion 23a and the second portion 23b can be electrically connected via the trench Tre without detouring to the end portion of the insulator 43. Thus, the limit value of the thickening amount of the word line WL can be increased without changing the size of the step structure in the XY plane.

The step structure in the hook-up area A2 includes a portion provided with a step along the X direction and a portion provided with a step along the Y direction. By such structure, the degree of integration of the hook-up area A2 can be increased in comparison to when a step is provided along one direction (for example, the X direction only).

In the case of a step structure in which steps are provided along different directions, in order to increase the degree of integration, the steps along one direction appear to be connected one by one, the steps along the other direction appear to be connected by two or more steps. Therefore, if the first portion 23a and the second portion 23b are to be electrically connected by detour of the end portion of the insulator 43, the conductor formed by detour of the step portion of two or more steps will be electrically connected to a plurality of conductors stacked on the two or more step portions. In other words, the conductor formed by detouring two or more steps can short out a plurality of word lines WL.

According to the first embodiment, the first portion 23a and the second portion 23b are electrically connected through the third portion 23c formed in the trench Tre. Thus, the third portion 23c can electrically connect the first portion 23a and the second portion 23b without using a path of detouring to the end portion of the insulator 43. Thus, the limit value of the thickening amount of the word line WL can be increased without shorting out a plurality of word lines WL in a step structure having two or more steps.

2. Second Embodiment

A semiconductor memory according to a second embodiment will be described. In the first embodiment, the trench Tre for embedding the third portion of the conductor is formed using lithography. The second embodiment differs from the first embodiment on the point of forming a sub-trench Sub for embedding a third portion of a conductor without using lithography. In the following description, mainly the configuration and processing steps different from the first embodiment will be described, and a description of equivalent configurations and processing steps will be omitted.

2.1 Configuration of Memory Cell Array

FIG. 18 is a plan view for explaining the structure of a memory cell array of a semiconductor memory according to the second embodiment. FIG. 18 corresponds to FIG. 3 described in the first embodiment.

As shown in FIG. 18, in the second embodiment, a spacer SW of an oxide film is provided between each of terrace areas Tsgd, Twl0 to Twl7, and Tsgs in an XY plane of a hook-up area A2. The spacer SW uses, for example, silicon dioxide ($SiO_2$).

Figure 19:
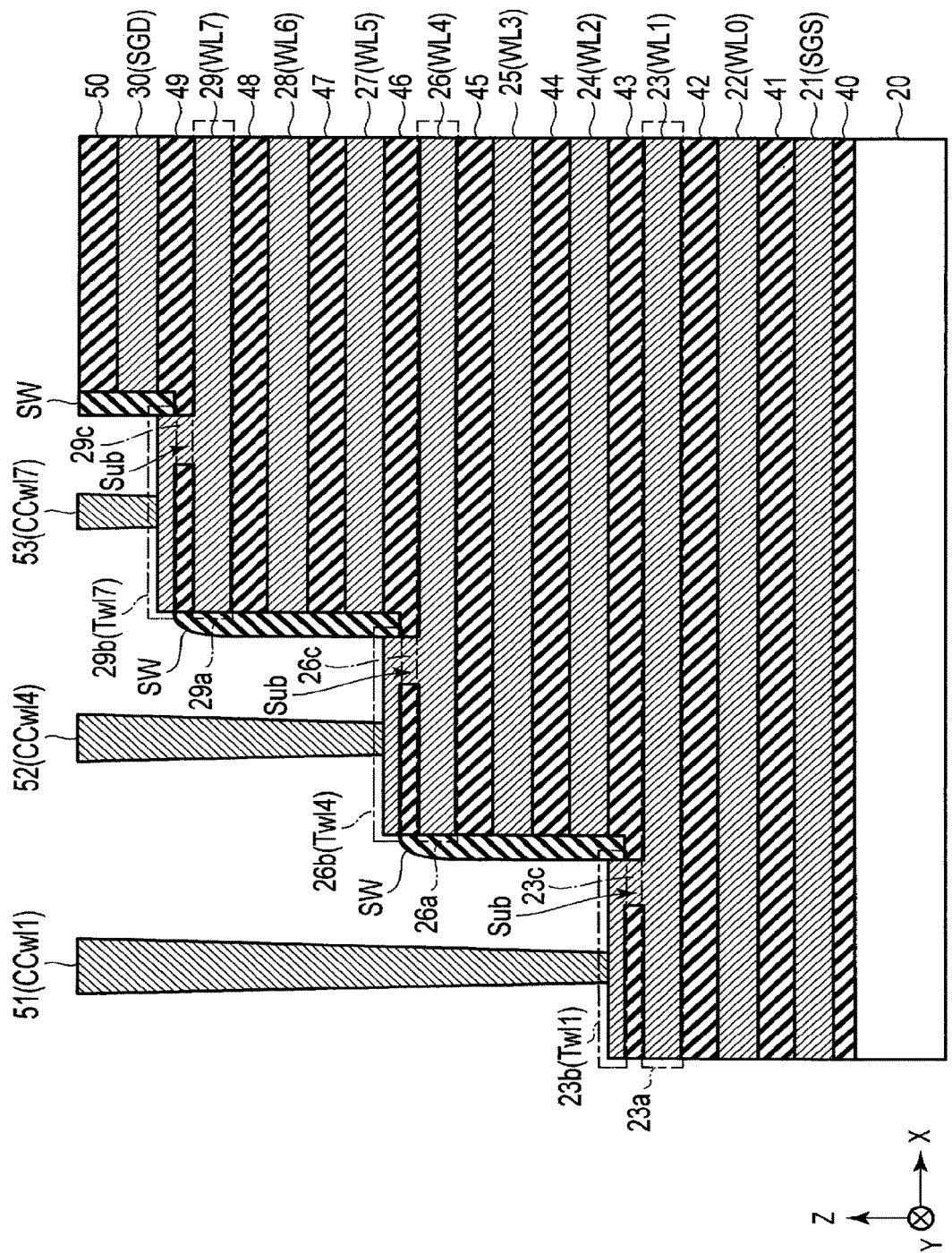
FIG. 19 is a cross-sectional view for explaining a configuration of the hook-up area of the semiconductor memory according to the second embodiment.

FIGS. 19 and 20 are a cross-sectional view for describing the structure of the hook-up area of the semiconductor memory according to the second embodiment, and correspond to FIGS. 5 and 6 described in the first embodiment. Specifically, FIGS. 19 and 20 respectively indicate an example of the cross-section structure along the XIX-XIX line and XX-XX line in the hook-up area A2 illustrated in FIG. 18.

As shown in FIG. 19, conductors 21 to 30 and insulators 41 to 50 are stacked stepwise having at least three steps along XIX-XIX line. In the aforementioned stepwise stacked structure, for example, terrace areas Twl1, Twl4, and Twl7 are respectively provided on the upper surface of first to third steps of a terrace.

Similar to the first embodiment, a conductor 23 includes a first portion 23a, a second portion 23b, and a third portion 23c. A conductor 26 includes a first portion 26a, a second portion 26b, and a third portion 26c. A conductor 29 includes a first portion 29a, a second portion 29b, and a third portion 29c.

The second portions 23b, 26b, and 29b of each conductor respectively correspond to terrace areas Twl1, Twl4, and Twl7. Each of the side surfaces of the stepwise stacked structure forms a spacer SW. The terrace areas Twl1, Twl4, and Twl7 are respectively separated by the spacers SW, in a step structure along the X direction, from side surfaces that include the conductors 24 to 26, side surfaces that include the conductors 27 to 29, and the side surface that includes the conductor 30.

The third portions 23c, 26c, and 29c of each conductor respectively correspond to a conductor embedded in the sub-trench Sub provided in a part of the insulators 43, 46, and 49. The sub-trench Sub is formed in an area contacting the spacer SW out of the area formed with the second portions 23b, 26b, and 29b.

FIG. 19 describes a stacked structure of a cross section along the terrace areas Twl1, Twl4, and Twl7 out of the cross section along X direction of the stepwise stacked structure, and the aforementioned stepwise stacked structure is formed similarly in the cross section along the other terrace area T.

In addition, as shown in FIG. 20, the conductors 21 to 23 and the insulators 41 to 43 are stacked stepwise having at least three steps along the XX-XX line. The aforementioned stepwise stacked structure is, for example, respectively provided with terrace areas Tsgs, Twl0, and Twl1 on an upper surface of a first to third steps.

Similar to the first embodiment, a conductor 21 includes a first portion 21a, a second portion 21b, and a third portion 21c. A conductor 22 includes a first portion 22a, a second portion 22b, and a third portion 22c.

The second portions 21b and 22b of each conductor respectively corresponds to terrace areas Tsgs and Twl0. Each of the side surfaces of the stepwise stacked structure forms the spacer SW. The terrace areas Tsgs and Twl0 are respectively separated from a side surface including the conductor 22 and the side surface including the conductor 23 in a stepwise stacked structure along the Y direction by the spacer SW.

The third portions 21c and 22c of each conductor correspond to a portion embedded with a sub-trench Sub provided in the insulators 41 and 42 out of the conductors 21 and 22. The sub-trench Sub is formed, in an area contacting spacer SW, out of the area formed with the second portions 21*b* and 22*b*.

FIG. 20 describes a stacked structure of a cross section along the terrace areas Tsgs, Twl0, and Twl1 out of the cross section along the Y direction of the stepwise stacked structure, and the aforementioned stepwise stacked structure is formed similarly in the cross section along the other terrace area T.

2.2 Manufacturing Method of Semiconductor Memory

Next, the method of manufacturing a semiconductor memory according to the second embodiment is described.

FIGS. 21 to 27 show an example of a cross-sectional structure of the hook-up area A2 in the manufacturing process of the semiconductor memory 1. Similar to the first embodiment, the following describes the processes from a process of stacking a replacement material and an insulator to a process of forming a contact plug CC on a terrace area T. Specifically, FIGS. 21 to 27 show a cross section of the hook-up area A2 obtained along the XIX-XIX line in FIG. 18.

A process similar to those described in FIGS. 7 and 8 of the first embodiment are performed. The stacked structure of the replacement materials 61 to 70 and insulators 41 to 50 are formed as a stepwise stacked structure in the hook-up area A2. The insulators 43, 46, and 49 provided on the upper surface of each terrace of the step structure is etched backed to about half its thickness. By such structure, the sub-trench Sub can be easily formed in a hereinafter described process.

Figure 21:
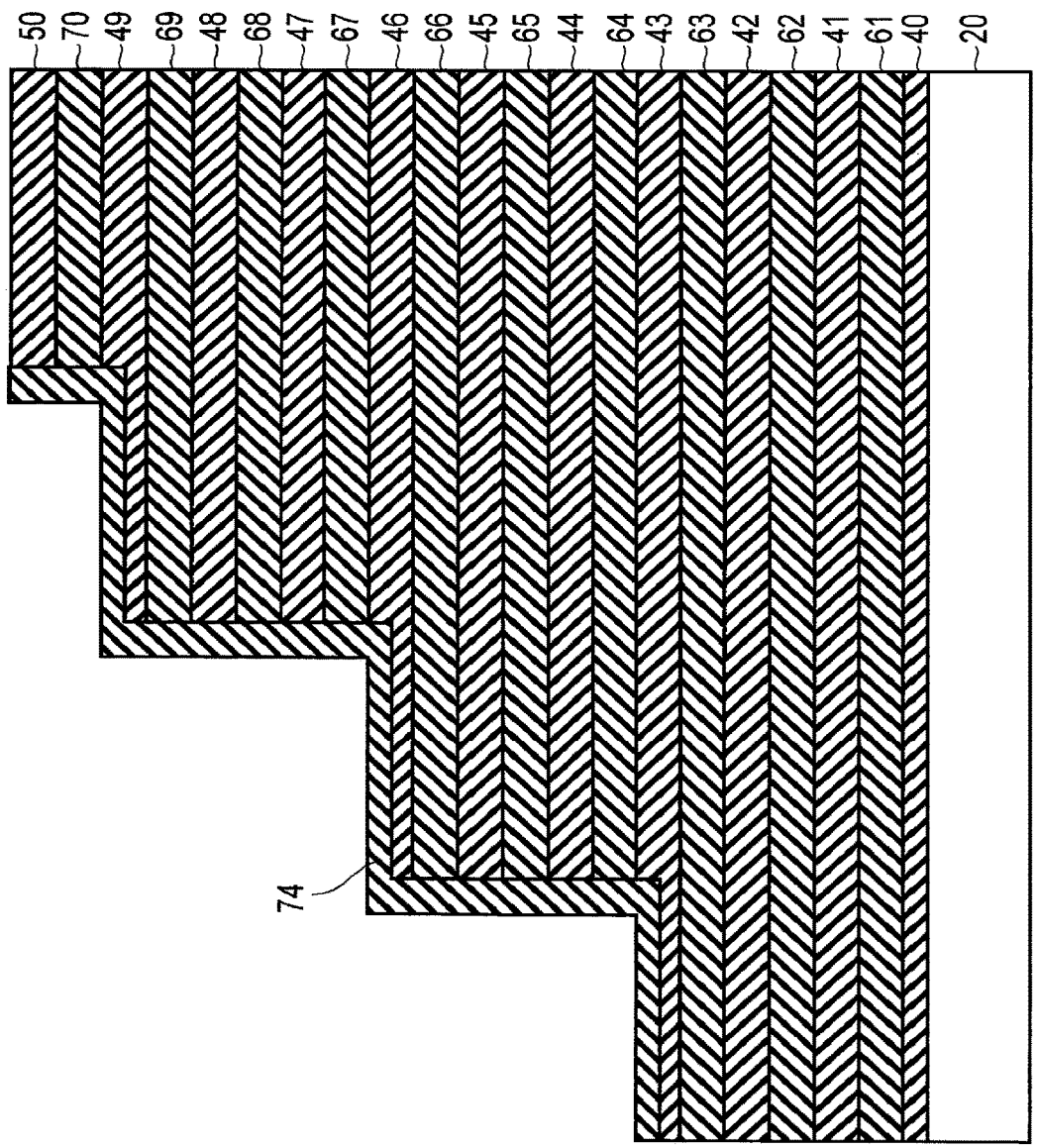
FIG. 21 is a cross-sectional view for explaining a manufacturing method of the semiconductor memory according to the second embodiment.

Next, as shown in FIG. 21, an oxide film 74 is provided to cover the upper surface of each terrace and side surface of each step of the step structure. The oxide film 74, for example, includes a silicon dioxide (SiO2). A part of the oxide film 74 can be used as a spacer SW in the hereinafter described process.

Figure 22:
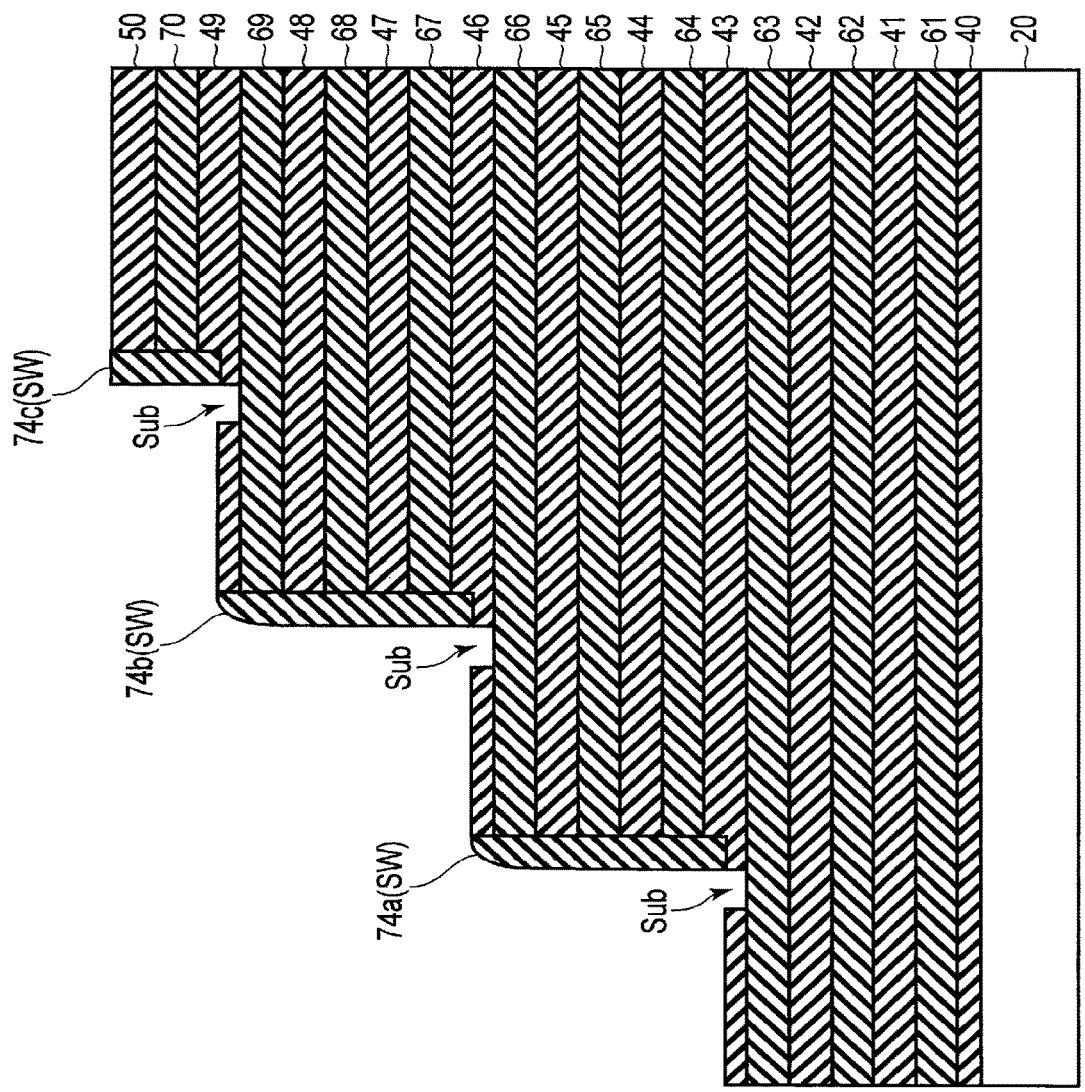
FIG. 22 is a cross-sectional view for explaining the manufacturing method of the semiconductor memory according to the second embodiment.

Next, as shown in FIG. 22, a spacer processing is executed to selectively retain the oxide film 74 formed on the side surface of the step structure. The spacer processing is achieved by executing anisotropic etching to increase the selection ratio in for example, the Z direction (vertical direction). By such structure, of the oxide film 74, each part provided on the upper surface of the insulators 43, 46, and 49 is removed and side walls 74*a*, 74*b*, and 74*c* are formed respectively on the side surfaces of the first to third steps.

By adjusting the etching condition in the spacer processing, spacers SW can be generated, and at the same time, a sub-trench Sub can be formed at a self-aligned positional relationship with surface of the spacers SW at a part along on the side surface of the step (step part) among the insulators 43, 46, and 49.

More specifically, the spacer processing, for example, is performed while lowering the flow rate of the etching gas and under high pressure conditions. The straightness of ions can be lowered by performing etching under high pressure conditions. Thus, the ions can easily enter an inner edge portion of the step structure along the side surface of the step. A reaction product generated by etching becomes difficult to be exhausted by lowering the flow rate of the etching gas. The spacer SW can be protected by facilitating the attachment of the reaction product to the oxide film 74 on the side surface of the step structure. Thus, while protecting the spacer SW, a sub-trench Sub along the side surface of the step structure covered by the spacer SW can be formed by a self-aligned arrangement with the spacer SW.

In the aforementioned spacer processing, the sub-trenches Sub formed on the first to third steps respectively reaches replacement materials 63, 66, and 69.

Figure 23:
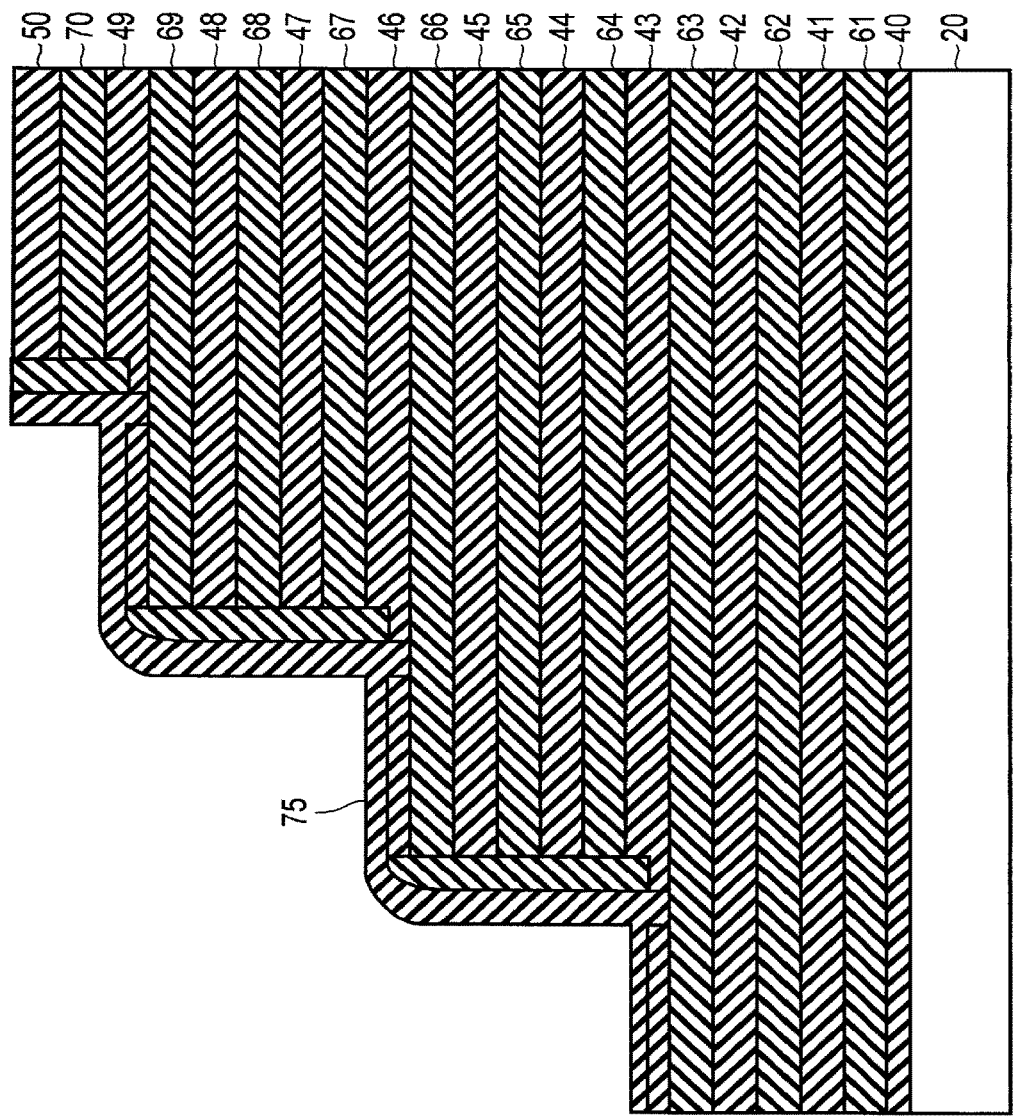
FIG. 23 is a cross-sectional view for explaining the manufacturing method of the semiconductor memory according to the second embodiment.

Then, as shown in FIG. 23, a replacement material 75 is provided to cover the upper surface of each terrace of the step structure (including the sub-trench Sub) and side surface of each step. The replacement material 75 includes, for example, silicon nitride (SiN) and is provided by, for example, PE-ALD.

Figure 24:
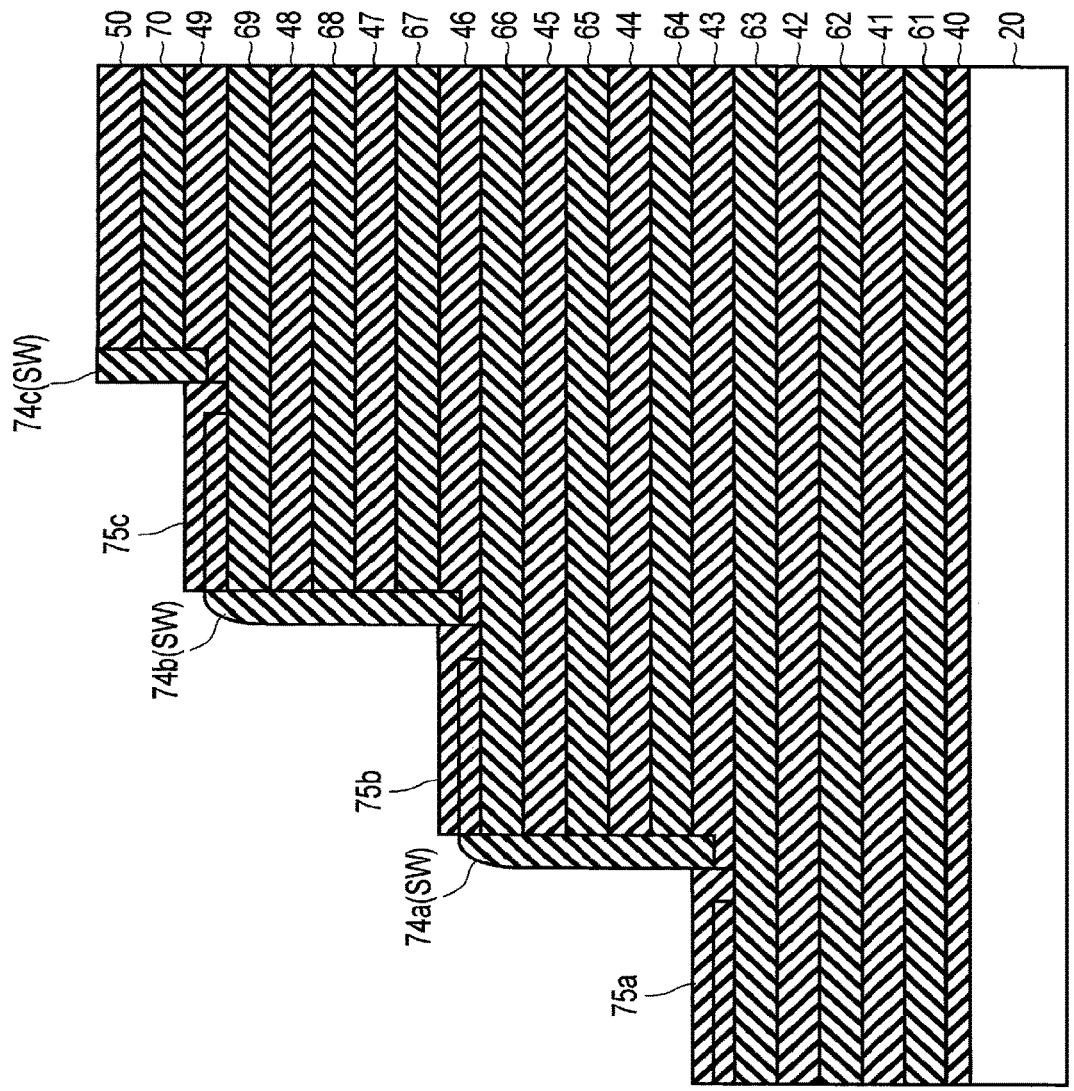
FIG. 24 is a cross-sectional view for explaining the manufacturing method of the semiconductor memory according to the second embodiment.

Next, as shown in FIG. 24, dry etching is performed on the replacement material 75 after providing a non-illustrated mask to an area excluding a portion provided on the side surface of the step structure out of the replacement material 75. By such structure, the replacement material 75 provided on the side surface of the step structure can be selectively removed. By removing the replacement material 75 of the side surface, the upper surface of the first to third steps of the terrace are respectively formed with replacement materials 75*a*, 75*b*, and 75*c*. Furthermore, the replacement materials 75*a* to 75*c* maintains the sub-trench Sub formed on side surface of each step at an embedded state.

Figure 25:
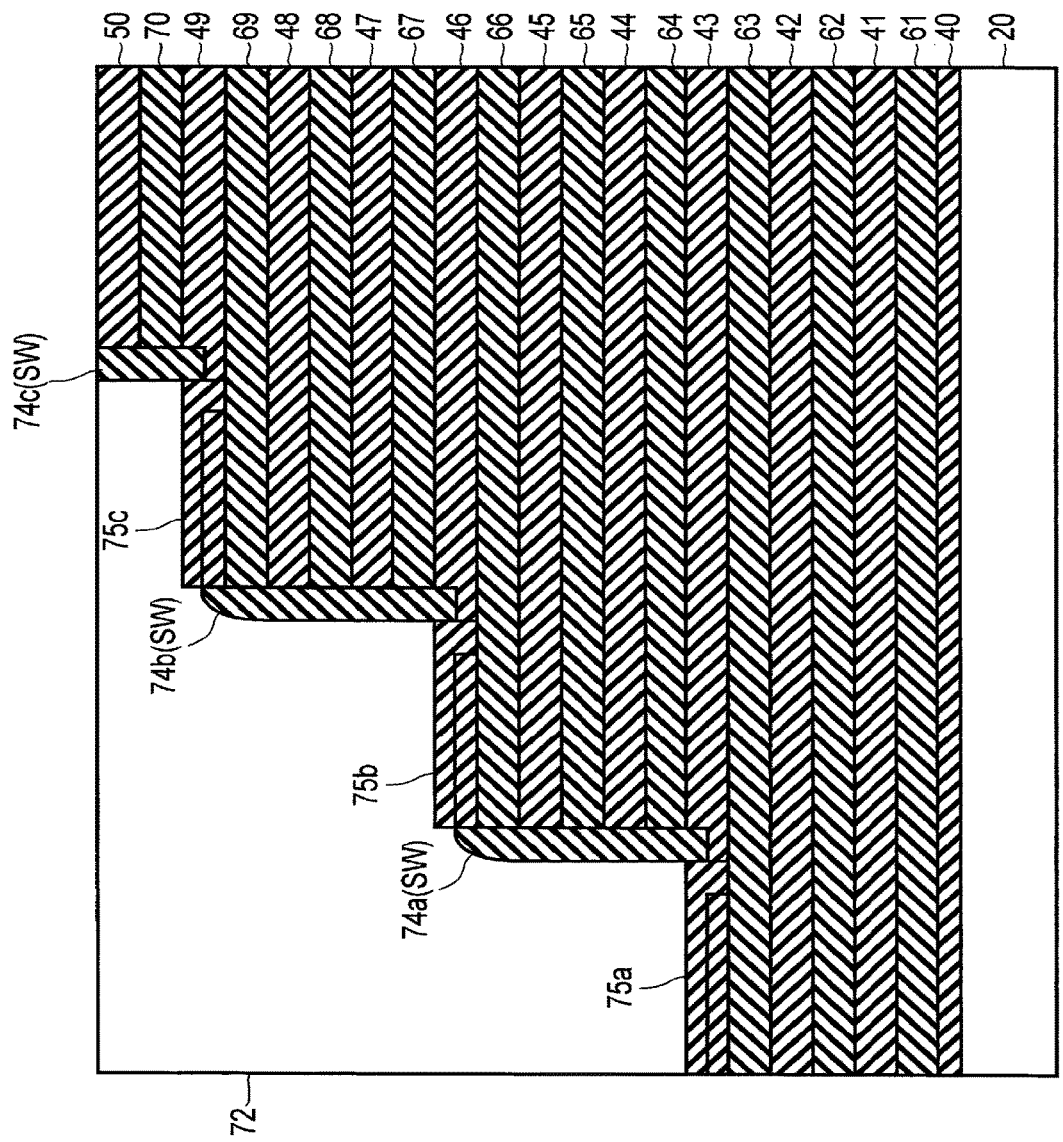
FIG. 25 is a cross-sectional view for explaining the manufacturing method of the semiconductor memory according to the second embodiment.

Next, an insulator 72 is provided to cover the step structure as shown in FIG. 25.

Then the replacement materials 61 to 70 and 75*a* to 75*c* are replaced with the conductors 21 to 30 as shown in FIG. 26. Specifically, the first portions 21*a* to 30*a* of the conductors 21 to 30 are respectively formed in the space formed by removing the replacement materials 61 to 70. The second portions 23*b*, 26*b*, and 29*b* of the conductors 23, 26, and 29 are respectively formed in the space formed by removing the replacement materials 75*a* to 75*c* positioned on the upper part of the insulators 43, 46, and 49 as terrace areas Twl1, Twl4, and Twl7. The third portions 23*c*, 26*c*, and 29*c* of the conductors 23, 26, and 29 are respectively formed in the space formed by removing replacement materials 75*a* to 75*c* embedded in the sub-trench Sub of the insulators 43, 46, and 49.

Figure 27:
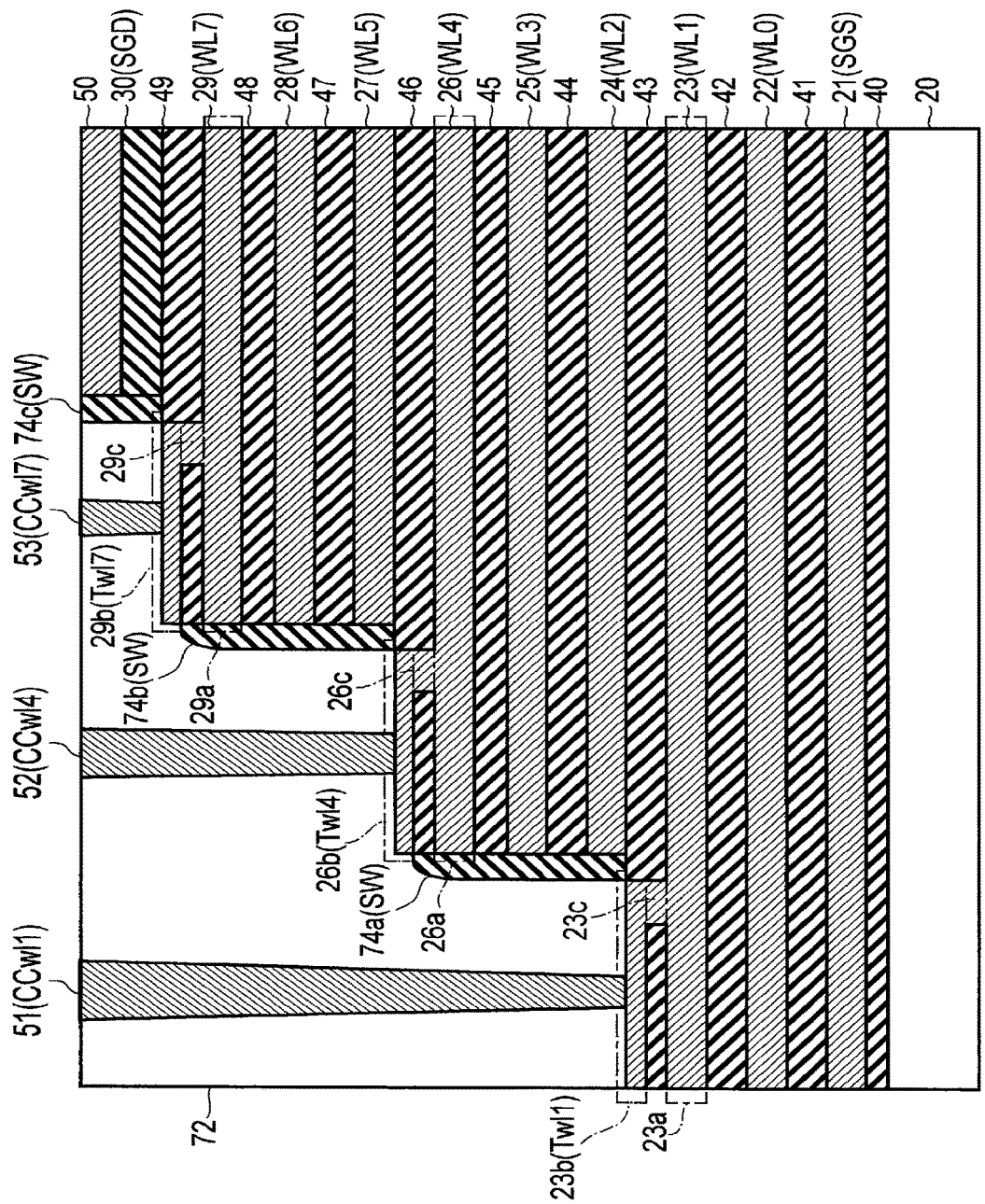
FIG. 27 is a cross-sectional view for explaining the manufacturing method of the semiconductor memory according to the second embodiment.

Next, as shown in FIG. 27, contact holes are collectively processed by performing lithography and anisotropic etching. Then conductors 51 to 53 are embedded in each of the contact holes and respective contact plugs CCwl1, CCwl4, and CCwl7 are formed.

By the above described manufacturing process, the hook-up area A2 of the memory cell array 10 of the semiconductor memory 1 and the contact plugs CC for supplying voltages to word lines WL etc. in the hook-up area A2 are formed.

2.3 Advantageous Effects According to Present Embodiment

In the second embodiment, for example, the third portion 23*c* of the conductor 23 is formed by embedding sub-trench Sub provided in the insulator 43. The sub-trench Sub formed in the insulator 43 can be simultaneously formed in the process for forming the spacer SW. By such structure, in the second embodiment, the first portion 23*a* and the second portion 23*b* of the conductor 23 can be electrically connected each other without the lithography processing. Thus, compared with the processing needed in the lithography processing, the limit value of the thickening amount of the word line WL can be increased by a simple processing, and punch-through of the contact plug CC can be prevented.

According to the second embodiment, the first portion 23*a* and the second portion 23*b* are electrically connected through the sub-trench Sub. Thus, the third portion 23*c* can electrical connect the first portion 23*a* and the second portion 23*b* without using a path of detouring to the end portion of the insulator 43. Therefore, similar to the first embodiment, the limit value of the thickening amount of the word line WL can be increased without shorting out a plurality of word lines WL in a step structure having two or more steps.

3. Others

The aforementioned first embodiment and second embodiment can be modified in, for example, the following manner.

In the first embodiment and the second embodiment, the hook-up area A2 is described as being a stacked structure including a step structure along the Y direction in the step structure along the X direction; however, it is not limited to such case. For example, the hook-up area A2 of the first embodiment and the second embodiment can be a stacked structure formed by only a step structure in the X direction.

The aforementioned first embodiment and the second embodiment describe the semiconductor memory 1 with a configuration of three-dimensionally arranging the memory cell transistors MT having the charge storage layer; however, it is not limited to this case. The configuration and the manufacturing process in the hook-up area A2 described in each of the embodiments above can be applied to other semiconductor storage devices. For example, the configuration and the manufacturing processing in the hook-up area A2 described in each of the embodiments can be applied to a semiconductor storage device with the configuration of three-dimensionally arranging a phase-change memory cell, or can be applied to a semiconductor storage device with the configuration of three-dimensionally arranging a memory cell using a ferroelectric thin film material.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the invention. The accompanying claims and their equivalents are intended to cover such forms or modifications as would fall within the scope and spirit of the invention.

What is claimed is:

1. A semiconductor device comprising:
   a stack body including an insulator, a first conductor and a second conductor stacked stepwise by interposing the insulator and electrically disconnected from each other; and
   a first contact plug which reaches the first conductor from a region above the stack body;
   wherein the first conductor includes a first portion positioned below the insulator, a second portion positioned above the insulator, and a third portion that electrically connects the first portion of the first conductor and the second portion of the first conductor,
   the third portion of the first conductor is provided in an opening formed in the insulator,
   the stack body includes a first area stacked stepwise along a first direction, and a second area stacked stepwise along a second direction intersecting the first direction, and a third conductor stacked stepwise to the first conductor interposing the insulator and electrically disconnected with the first conductor and the second conductor;
   the device further comprising:
   a second contact plug which reaches the second conductor in the first area from the region above the stack body; and
   a third contact plug which reaches the third conductor in the second area from the region above the stack body.

2. The device of claim 1, wherein the third portion of the first conductor is formed along a first step portion between the first conductor and the second conductor.

3. The device of claim 1, further comprising:
   an insulating spacer formed on a side surface of a first step portion between the first conductor and the second conductor.

4. The device of claim 3, wherein the third portion of the first conductor is formed along the spacer.

5. The device of claim 1, wherein an area of the insulator provided with the second portion of the first conductor on an upper surface is thinner than an area of the insulator provided with the second conductor on an upper surface.

6. The device of claim 1, further comprising:
   a semiconductor pillar passing through the stack body along a third direction which intersects with the first direction and the second direction;
   a first charge storage portion provided between the semiconductor pillar and the first conductor; and
   a second charge storage portion provided between the semiconductor pillar and the second conductor.

7. The device of claim 1, further comprising:
   a first memory cell transistor including a gate electrically connected to the first conductor; and
   a second memory cell transistor including a gate electrically connected to the second conductor.

8. The device of claim 1, wherein the second conductor is provided on an upper surface of the insulator, and
   the third conductor is provided above the second conductor.

9. The device of claim 1, wherein the third portion of the first conductor is formed along a first step portion between the first conductor and the second conductor, and a second step portion between the first conductor and the third conductor.

10. The device of claim 9, wherein a step of the second step portion is larger than a step of the first step portion.

* * * * *